(12) United States Patent
Walker

(10) Patent No.: US 7,732,321 B2
(45) Date of Patent: Jun. 8, 2010

(54) METHOD FOR SHIELDING INTEGRATED CIRCUITS

(75) Inventor: John Fleming Walker, Little Milton (GB)

(73) Assignee: NDS Limited, Staines, Middlesex (GB)

( * ) Notice: Subject to any disclaimer, the term of this patent is extended or adjusted under 35 U.S.C. 154(b) by 441 days.

(21) Appl. No.: 10/593,386

(22) PCT Filed: May 4, 2005

(86) PCT No.: PCT/GB2005/001709
§ 371 (c)(1),
(2), (4) Date: Dec. 4, 2006

(87) PCT Pub. No.: WO2005/114733
PCT Pub. Date: Dec. 1, 2005

(65) Prior Publication Data
US 2008/0093742 A1    Apr. 24, 2008

Related U.S. Application Data

(60) Provisional application No. 60/572,434, filed on May 19, 2004, provisional application No. 60/652,673, filed on Feb. 14, 2005, provisional application No. 60/659,133, filed on Mar. 7, 2005.

(30) Foreign Application Priority Data
May 17, 2004    (GB)    .................................. 0410975.7

(51) Int. Cl.
*H01L 21/4763* (2006.01)
(52) U.S. Cl. ........................ 438/618; 438/614; 438/620; 438/622
(58) Field of Classification Search .......... 438/612–624
See application file for complete search history.

(56) References Cited

U.S. PATENT DOCUMENTS 4,214,918 A    7/1980    Gat et al.

(Continued)

FOREIGN PATENT DOCUMENTS

EP    0 585 601    3/1994

(Continued)

OTHER PUBLICATIONS

Sonntag et al., "Infineon Introduces Chip Card Controllers for Improved Security of Electronic Identity Cards and Passports" (Infineon Technologies AG, Jul. 7, 2004), available on the World Wide Web at: www.infineon.com/cgi/ecrm.dll/jsp/showfrontend. do?lang=EN&BV_SessionID=@@@@0590998578. 1109855404@@@@&BV_EngineID=ccchadddmlfid-dkcflgcegndfifdfoh.0& content_type=NEWS&content_oid=107623& news_nav_oid=9979.

(Continued)

*Primary Examiner*—Dung A. Le
(74) *Attorney, Agent, or Firm*—Husch Blackwell Sanders LLP Welsh & Katz

(57) ABSTRACT

A method for adding an additional layer to an integrated circuit, the method including providing an integrated circuit having an interconnect layer, depositing, over substantially all of an exposed surface of the integrated circuit, an additional layer of material whose conductivity can be altered, and selectively altering the conductivity of a first portion of the additional layer by selective annealing, to produce a sub-circuit in the additional layer, the sub-circuit being in operative electrical communication with the integrated circuit. Related apparatus and methods are also described.

33 Claims, 16 Drawing Sheets

U.S. PATENT DOCUMENTS

| | | | |
|---|---|---|---|
| 4,339,285 A * | 7/1982 | Pankove | 438/663 |
| 4,583,011 A | 4/1986 | Pechar | |
| 4,766,516 A | 8/1988 | Ozdemir et al. | |
| 4,908,226 A * | 3/1990 | Kubena et al. | 427/526 |
| 4,920,402 A | 4/1990 | Nakaya et al. | |
| 5,336,624 A | 8/1994 | Walden | |
| 5,468,990 A | 11/1995 | Daum | |
| 5,783,846 A | 7/1998 | Baukus et al. | |
| 5,793,095 A * | 8/1998 | Harvey | 257/530 |
| 5,821,582 A | 10/1998 | Daum | |
| 5,824,571 A | 10/1998 | Rollender et al. | |
| 5,866,933 A | 2/1999 | Baukus et al. | |
| 5,883,000 A | 3/1999 | Pasch | |
| 5,930,663 A | 7/1999 | Baukus et al. | |
| 5,973,375 A | 10/1999 | Baukus et al. | |
| 6,064,110 A | 5/2000 | Baukus et al. | |
| 6,117,762 A | 9/2000 | Baukus et al. | |
| 6,294,816 B1 | 9/2001 | Baukus et al. | |
| 6,360,321 B1 | 3/2002 | Gressel et al. | |
| 6,495,919 B2 * | 12/2002 | Farrar | 257/759 |
| 6,496,119 B1 | 12/2002 | Otterstedt et al. | |
| 6,515,304 B1 | 2/2003 | Kash et al. | |
| 6,613,661 B1 | 9/2003 | Baukus et al. | |
| 6,720,656 B2 | 4/2004 | Matsumoto | |
| 2001/0033012 A1 | 10/2001 | Kommerling et al. | |
| 2002/0173131 A1 | 11/2002 | Clark, Jr. et al. | |

FOREIGN PATENT DOCUMENTS

| | | |
|---|---|---|
| EP | 0 940 851 | 9/1999 |
| WO | WO 97/29567 | 8/1997 |
| WO | WO 01/50530 | 7/2001 |
| WO | WO 01/54194 | 7/2001 |

OTHER PUBLICATIONS

Jul. 1, 2009 Office Communication in connection with prosecution of EP 05 740 533.4 (4 pages).

* cited by examiner

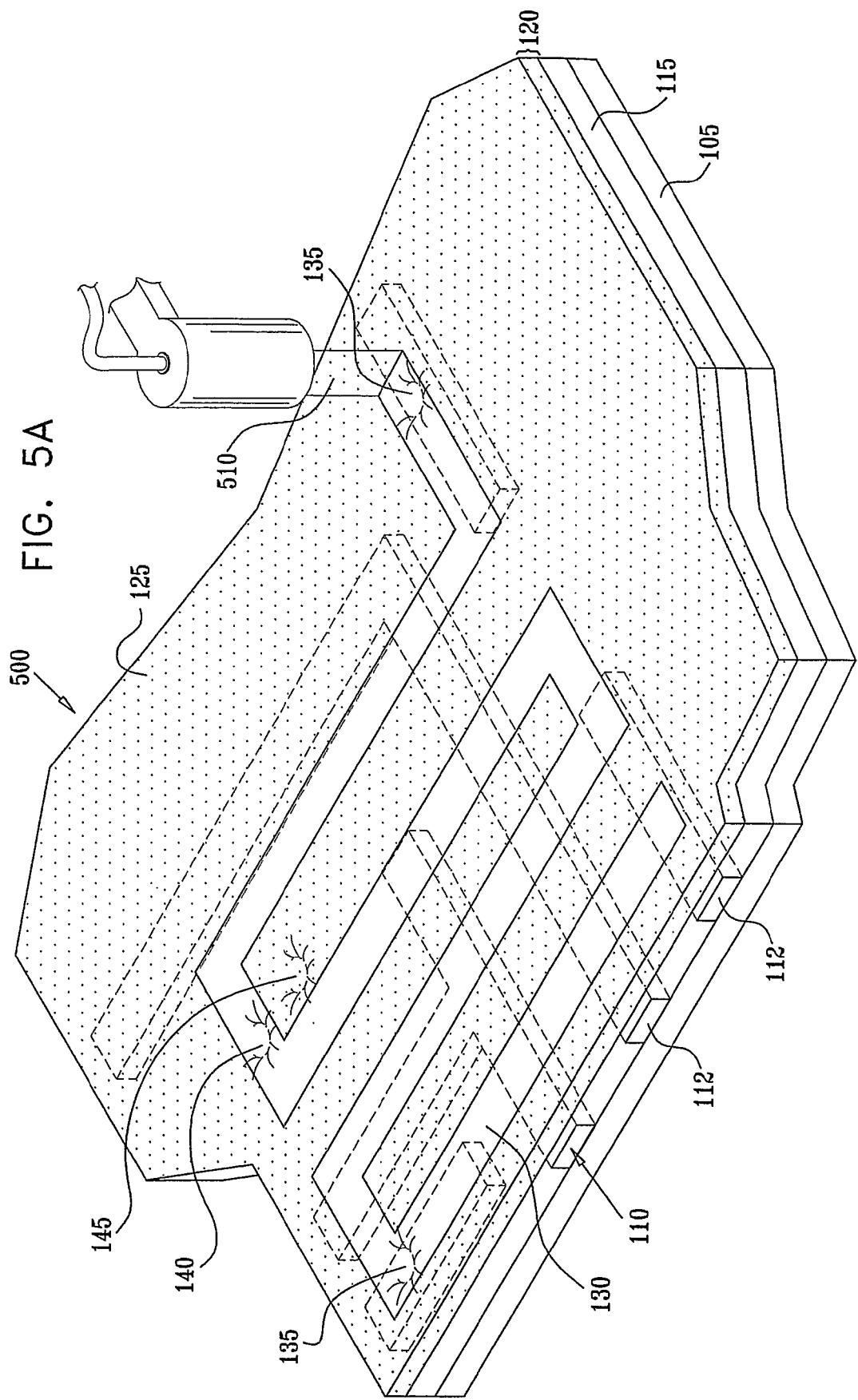

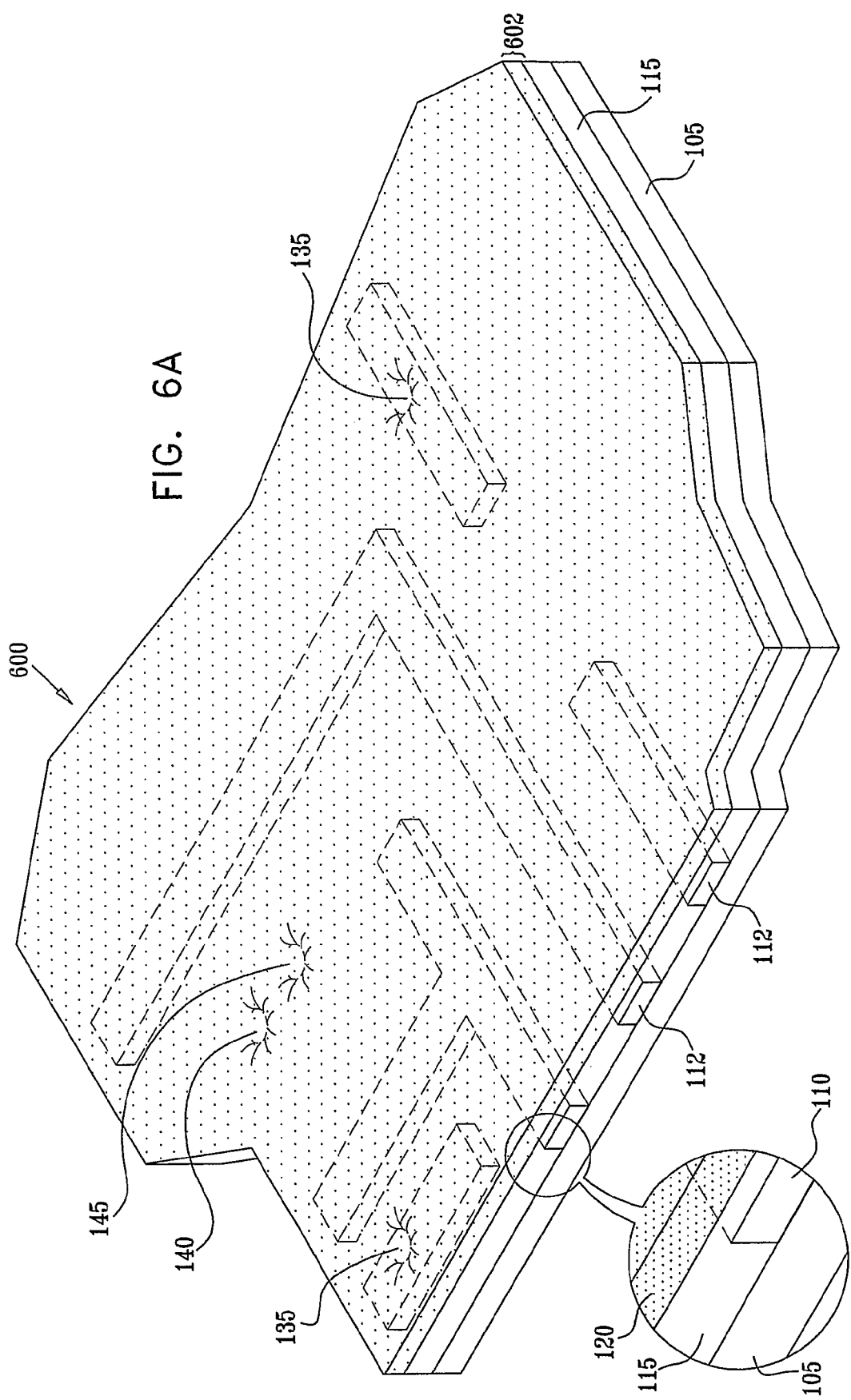

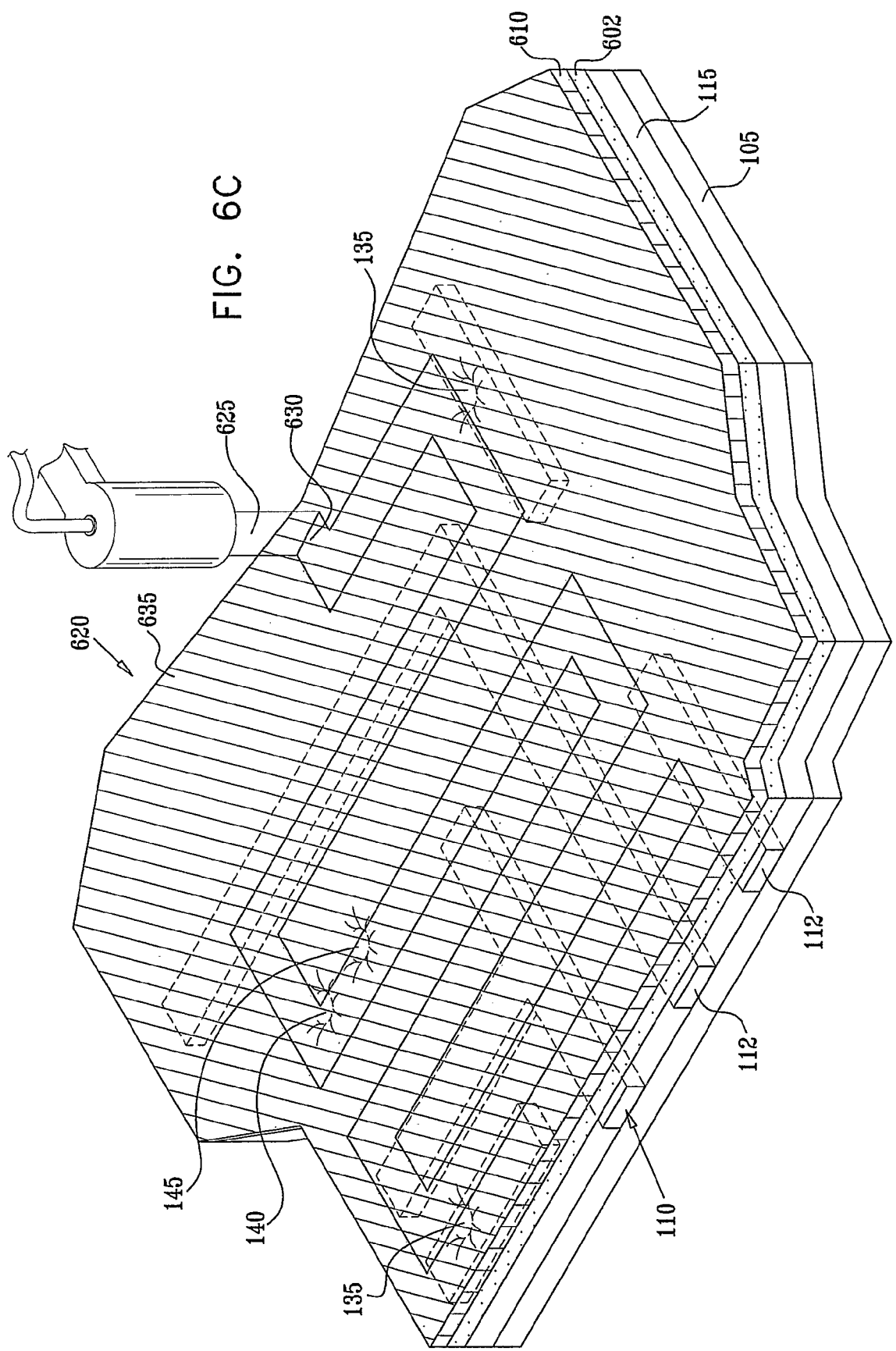

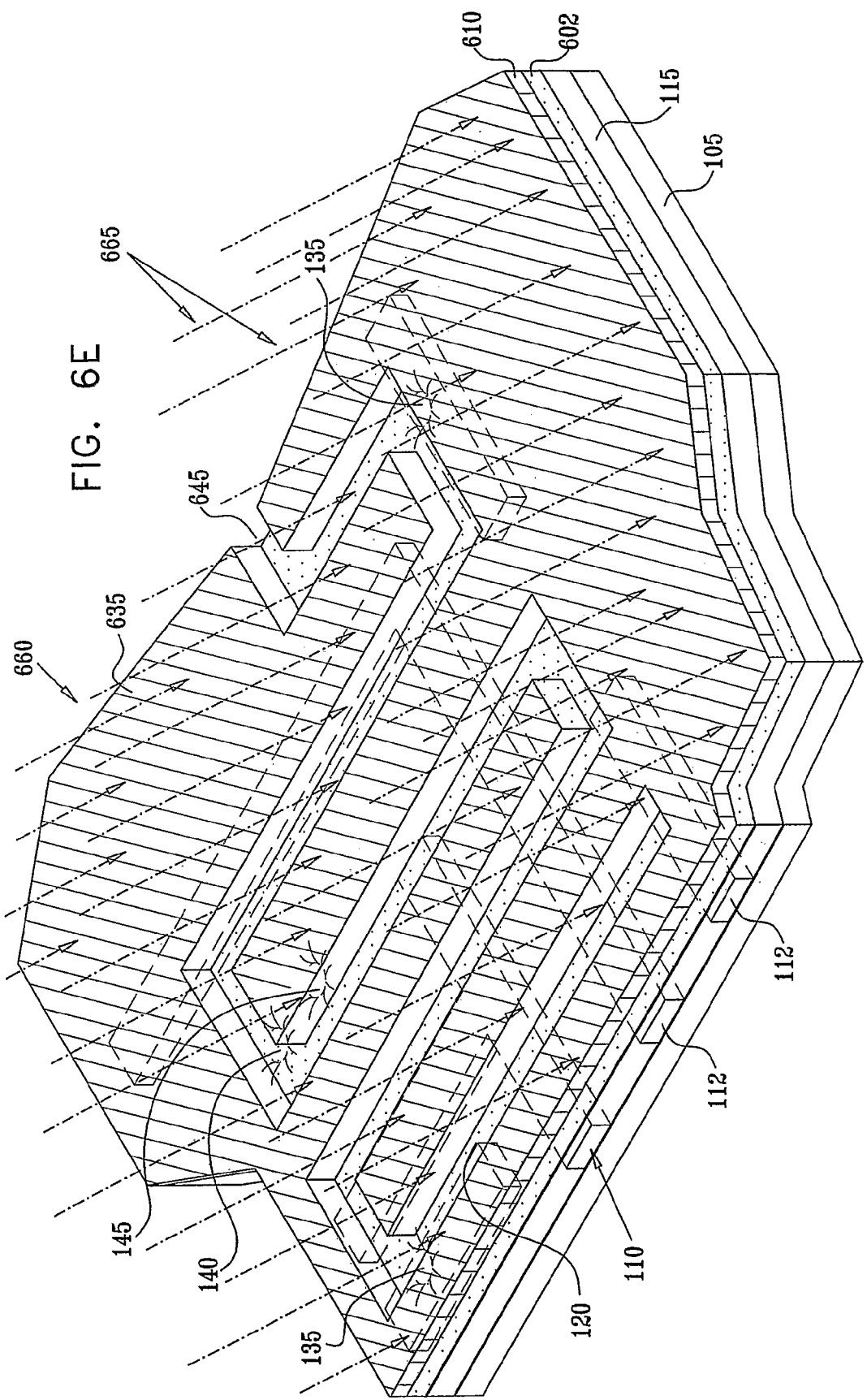

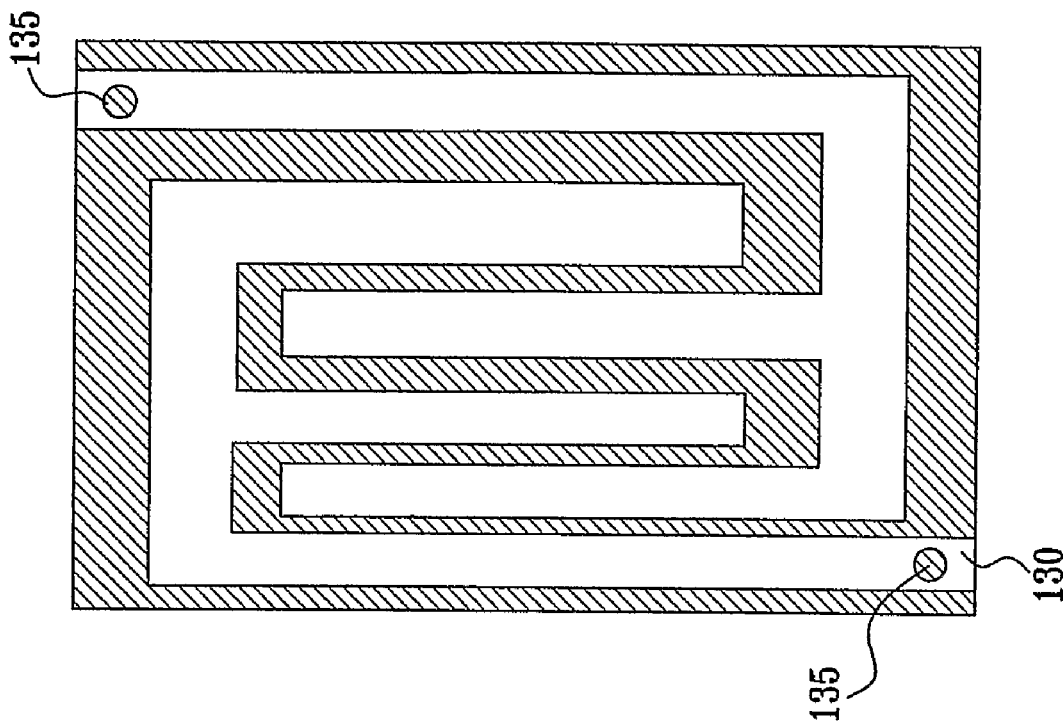
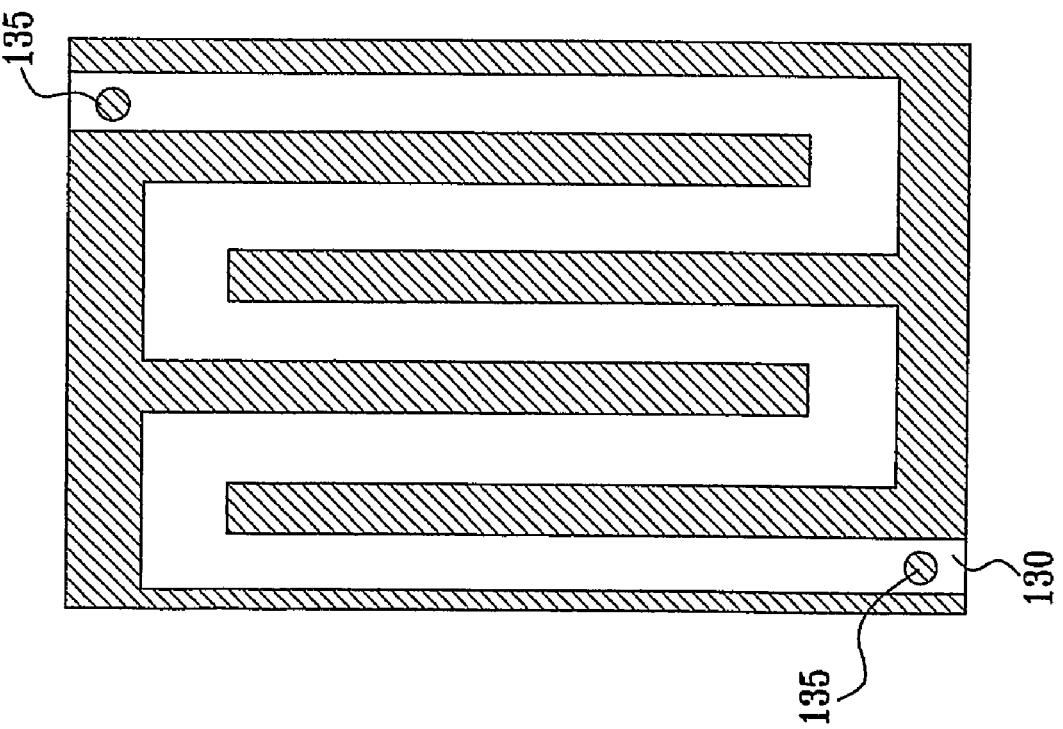

METHOD FOR SHIELDING INTEGRATED CIRCUITS

RELATED APPLICATION INFORMATION

The present application is a 35 USC 0371 application of PCT Patent Application PCT/GB2005/001709, filed on 4 May 2005, published in the English language as WO 2005/114733 on 1 Dec. 2005, which claims priority from the following applications, the disclosures of which are hereby incorporated herein by reference: UK Patent Application No. 0410975.7, of NDS Limited, filed 17 May 2004; U.S. Provisional Patent Application Ser. No. 60/572,434, of Walker, filed 19 May 2004; U.S. Provisional Patent Application Ser. No. 60/652,673, of Walker, filed 14 Feb. 2005; and U.S. Provisional Patent Application Ser. No. 60/659,133, of Walker, filed 7 Mar. 2005.

FIELD OF THE INVENTION

The present invention relates to protecting integrated circuits from invasive attack through the use of a shield.

BACKGROUND OF THE INVENTION

Security integrated circuits, commonly known as "security chips", are of use to those wanting to protect information, data transmissions or value (typically monetary). These security chips protect data by storing it in secure memory or transmit data securely through the use of cryptography implemented on chip. There are many reasons for using these products including secure banking cards, secure access systems and secure personal identity systems. It is known in the art to protect these chips from invasive attacks whereby criminals and other agents attack the card to try to obtain, change or use secret information on the card.

One type of attack involves trying to place contacts onto internal chip nodes in order to read internal data traffic. This may be achieved by probing, using fine needles to break through the surface passivation to reach the fine metal tracks. Alternatively focused ion beam (FIB) may be used to deposit pads of metal onto the tracks for subsequent probing or bonding by wires. However it is achieved, measuring the signals on internal chip nodes represents an attack, and if successful this attack may render the chip and entire system on which it is based, insecure.

Shields to protect a chip from the above attacks exist at present; they are typically divided into two categories, active and passive. Passive shields are simple metal layers over all or part of the circuit and are designed to prevent viewing and probing. Passive shields may be removed by chemical, plasma or other techniques without changing the operation of the circuit. In other words, a passive shield works to deter attackers by making viewing more difficult initially, but will not actively defend itself against removal.

Active shields may look similar or may look more like a network of lines covering all or part of a circuit. If a line or part of the shield is removed, severed or short-circuited to another line, the breach is detected and the chip halts some or all functions.

Active shields may still be breached using, for example, the following technique. An active shield line is identified as above the circuit element to be attacked. The shield line is bypassed using the ability of the FIB system previously mentioned. The bypass is in the form of a diversion track added in parallel to the original shield track. The original shield track may now be removed leaving the new bypass to fool the detection circuit. No circuit break is detected.

The following references are believed to represent the state of the art:
U.S. Pat. No. 4,214,918 to Gat et al;
U.S. Pat. No. 4,583,011 to Pechar;
U.S. Pat. No. 4,766,516 to Ozdemir et al;
U.S. Pat. No. 4,920,402 to Nakaya et al;
U.S. Pat. No. 5,336,624 to Walden;
U.S. Pat. No. 5,468,990 to Daum;
U.S. Pat. No. 5,783,846 to Baukus et al;
U.S. Pat. No. 5,821,582 to Daum;
U.S. Pat. No. 5,824,571 to Rollender et al;
U.S. Pat. No. 5,866,933 to Baukus et al;
U.S. Pat. No. 5,930,663 to Baukus et al;
U.S. Pat. No. 5,973,375 to Baukus et al;
U.S. Pat. No. 6,064,110 to Baukus et al;
U.S. Pat. No. 6,117,762 to Baukus et al;
U.S. Pat. No. 6,294,816 to Baukus et al;
U.S. Pat. No. 6,360,321 to Gressel et al;
U.S. Pat. No. 6,613,661 to Baukus et al;
U.S. Pat. No. 6,720,656 to Matsumoto;
US Published Patent Application 2001/0033012 of Koemmerling et al;
US Published Patent Application 2002/0173131 of Clark JR et al;
PCT Published Patent Application WO 97/29567 of Fortress U & T Ltd.;
PCT Published Patent Application WO 01/50530 of Koemmerling et al;
PCT Published Patent Application WO 01/54194 of NDS Limited;
EP Published Patent Application No. EP 0 585 601 of Hughes Electronics Corporation;
EP Published Patent Application No. EP 0 940 851 of Hughes Electronics Corporation; and
An article entitled "*Infineon Introduces Chip Card Controllers for Improved Security of Electronic Identity Cards and Passports*", available on the World Wide Web at www.infineon.com/cgi/ecrm.dll/jsp/showfrontend.do?lang=EN&BV_SessionID=@@@@0590998578.1109855404 @@@@&BV_EngineID=ccchadddmlfiddkcflg cegndfifdfoh.0&content_=NEWS&content_oid=107623& news_nav_oid=9979.

The disclosures of all references mentioned above and throughout the present specification, as well as the disclosures of all references mentioned in those references, are hereby incorporated herein by reference.

SUMMARY OF THE INVENTION

The present invention, in preferred embodiments thereof, comprises an active shield produced in such a way that individual tracks are not visible by any normal microscopy technique. The tracks are preferably present in a layer of semiconductor material. The tracks preferably comprise doped regions separated by semi-insulating regions of either undoped material, or differently doped material. The tracks are doped sufficiently to allow conduction of electronic carriers. Between the tracks, the material, doped or undoped, is depleted of carriers. This region is rendered semi-insulating through the lack of intrinsic or extrinsic carriers, or through the trapping of such carriers.

The conductive region is preferably formed into tracks which form part of an active shield as described above. Most preferably, the conductive lines and the insulating regions between them are produced using similar techniques in such a way as to cause the conductive lines and the insulating regions to appear identical to most or all readily available analytical techniques. An attacker therefore does not know where to bypass the active shield lines.

Preferably the path of the conductive tracks is randomized for each shielded chip produced. The randomization helps prevent attackers from characterizing a device destructively to find the shield path, and then applying the information gained to a pristine device. Shield breach detection circuitry is preferably added to the circuitry of the chip, so that when a breach in the active shield is detected, the detection initiates a "breach detected" mode designed to protect the chip from operating insecurely, as is well-known in the art.

There is thus provided in accordance with a preferred embodiment of the present invention a method for adding an additional layer to an integrated circuit, the method including providing an integrated circuit having an interconnect layer, depositing, over substantially all of an exposed surface of the integrated circuit, an additional layer of material whose conductivity can be altered, and selectively altering the conductivity of a first portion of the additional layer by selective annealing, to produce a sub-circuit in the additional layer, the sub-circuit being in operative electrical communication with the integrated circuit.

Further in accordance with a preferred embodiment of the present invention the selective annealing includes selective laser annealing.

Still further in accordance with a preferred embodiment of the present invention the sub-circuit is not visually distinguishable from a second portion of the additional layer, the second portion being disjoint from the first portion.

Additionally in accordance with a preferred embodiment of the present invention the second portion includes substantially all parts of the additional layer not included in the first portion.

Moreover in accordance with a preferred embodiment of the present invention the selectively altering includes altering substantially without removing any part of the additional layer.

There is also provided in accordance with another preferred embodiment of the present invention an integrated circuit produced by any of the above-mentioned methods.

There is also provided in accordance with still another preferred embodiment of the present invention a method for adding an additional layer to a plurality of integrated circuits, the method including providing a plurality of integrated circuits, each having an interconnect layer, performing the following for each one of the plurality of integrated circuits: depositing, over substantially all of an exposed surface of the one integrated circuit, an additional layer of material whose conductivity can be altered, and selectively altering the conductivity of a first portion of the additional layer by selective annealing, to produce a sub-circuit in the additional layer, the sub-circuit being in operative electrical communication with the integrated circuit, wherein the first portion of each integrated circuit has a shape, and, for at least a first integrated circuit and a second integrated circuit of the plurality of integrated circuits, the shape of the first portion of the first integrated circuit is different from the shape of the first portion of the second integrated circuit.

Further in accordance with a preferred embodiment of the present invention the shape of the first portion of each one of the plurality of integrated circuits on a production wafer is different from the shape of the first portion of any other of the plurality of integrated circuits on the production wafer.

Still further in accordance with a preferred embodiment of the present invention the selective annealing includes selective laser annealing.

Additionally in accordance with a preferred embodiment of the present invention the sub-circuit is not visually distinguishable from a second portion of the additional layer, the second portion being disjoint from the first portion.

Moreover in accordance with a preferred embodiment of the present invention the second portion includes substantially all parts of the additional layer not included in the first portion.

Further in accordance with a preferred embodiment of the present invention the selectively altering includes altering substantially without removing any part of the additional layer.

There is also provided in accordance with another preferred embodiment of the present invention a plurality of integrated circuits, produced by any of the above-mentioned methods relating to a plurality of integrated circuits.

There is also provided in accordance with still another preferred embodiment of the present invention a method for adding an additional layer to an integrated circuit, the method including providing an integrated circuit having an interconnect layer, depositing, over substantially all of an exposed surface of the integrated circuit, an additional layer of material whose conductivity can be altered, selectively doping only a first portion of the additional layer of material, and selectively altering the conductivity of the first portion of the additional layer by annealing, to produce a sub-circuit in the additional layer, the sub-circuit being in operative electrical communication with the integrated circuit.

Further in accordance with a preferred embodiment of the present invention the sub-circuit is not visually distinguishable from a second portion of the additional layer, the second portion being disjoint from the first portion.

Still further in accordance with a preferred embodiment of the present invention the second portion includes substantially all parts of the additional layer not included in the first portion.

There is also provided in accordance with another preferred embodiment of the present invention an integrated circuit produced by any of the above methods.

There is also provided in accordance with still another preferred embodiment of the present invention a method for adding an additional layer to a plurality of integrated circuits, the method including providing a plurality of integrated circuits, each having an interconnect layer, depositing, over substantially all of an exposed surface of each of the plurality of integrated circuits, an additional layer of material whose conductivity can be altered, for each one of the plurality of integrated circuits, selectively doping only a first portion of the additional layer of material of the one integrated circuit, and selectively altering the conductivity of the first portion of the additional layer of each of the plurality of integrated circuits by annealing, to produce a sub-circuit in the additional layer, the sub-circuit being in operative electrical communication with the integrated circuit, wherein the first portion of each integrated circuit has a shape, and, for at least a first integrated circuit and a second integrated circuit of the plurality of integrated circuits, the shape of the first portion of the first integrated circuit is different from the shape of the first portion of the second integrated circuit.

Further in accordance with a preferred embodiment of the present invention the shape of the first portion of each one of the plurality of integrated circuits on a production wafer is different from the shape of the first portion of any other of the plurality of integrated circuits on the production wafer.

Still further in accordance with a preferred embodiment of the present invention the sub-circuit is not visually distinguishable from a second portion of the additional layer, the second portion being disjoint from the first portion.

Additionally in accordance with a preferred embodiment of the present invention the second portion includes substantially all parts of the additional layer not included in the first portion.

There is also provided in accordance with another preferred embodiment of the present invention a plurality of integrated circuits, produced by any of the above-mentioned methods relating to a plurality of integrated circuits.

There is also provided in accordance with still another preferred embodiment of the present invention an integrated circuit including a lower integrated circuit portion including an interconnect layer, and an additional layer of material disposed over substantially all of a surface of the lower integrated circuit portion, the additional layer including a first portion, the first portion including a sub-circuit in operative electrical communication with the lower integrated circuit portion, the sub-circuit being not visually distinguishable from a second portion of the additional layer, the second portion being disjoint from the first portion.

Further in accordance with a preferred embodiment of the present invention the second portion includes substantially all parts of the additional layer not included in the first portion.

BRIEF DESCRIPTION OF THE DRAWINGS

The present invention will be understood and appreciated more fully from the following detailed description, taken in conjunction with the drawings in which:

FIGS. 2-4, 5A, and 5B are simplified pictorial illustrations depicting a preferred method of producing the integrated circuit of FIG. 1;

FIGS. 6A-6F are simplified pictorial illustrations depicting an alternative preferred method of producing the integrated circuit of FIG. 1;

FIGS. 7A and 7B are simplified pictorial illustrations depicting alternative preferred patterns of the conductive portion of the protective layer of the integrated circuit of FIG. 1;

DETAILED DESCRIPTION OF PREFERRED EMBODIMENTS

Figure 1:
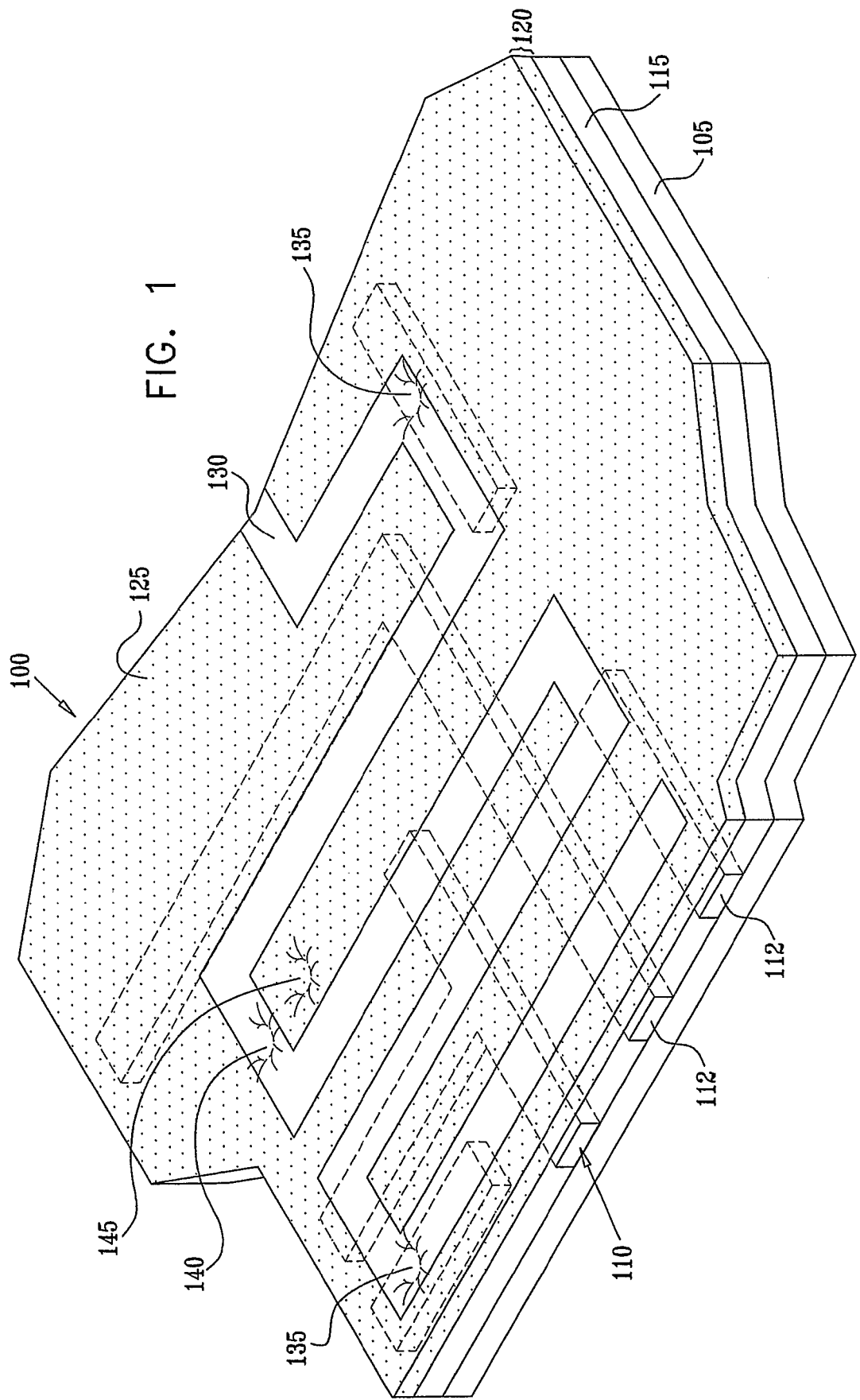
FIG. 1 is a simplified pictorial illustration of an integrated circuit having a protective layer, the integrated circuit being constructed and operative in accordance with a preferred embodiment of the present invention.

The present invention, in preferred embodiments thereof, provides a method to protect a security chip from invasive attacks. Preferably, a layer is added above the layers of the circuit to be protected from attack. The added layer may be made of polycrystalline silicon, as this material is commonly used in the manufacturing of integrated circuits, but may alternatively be made of many other suitable materials. Any material whose conductivity can be materially changed without being visibly different would be a candidate for the material to be used in the added layer. The added layer is typically applied toward the end of the chip manufacturing process, and is applied above the normal circuit interconnect layers. The added layer may also be protected by a passivation layer deposited above it, as is typically used in integrated circuits.

The added layer is preferably implanted with dopants to allow conduction.

In a first preferred embodiment of the present invention, dopants are selectively implanted in tracks corresponding to where the designer wants them placed, as follows:

A layer of photo-resist is placed on top of the newly added layer, and the desired pattern of tracks is created in the photo-resist by any appropriate method, such methods being well-known in the art.

The photo-resist is developed, leaving the desired track pattern bare, with the rest of the wafer being still covered by photo-resist.

Dopants may then be implanted in the material by high energy ion bombardment or by any other appropriate method. Dopants are thus implanted in the desired pattern of tracks (and also, incidentally, in the photo-resist).

The photo-resist is then removed from the wafer, leaving the dopants selectively implanted in the desired pattern of tracks.

In a second preferred embodiment the present invention utilizes either blanket bombardment of the layer with dopant ions or incorporation of the dopants during the growth of the layer. The latter approach will typically be achieved in the case of doped polysilicon, by chemical vapor deposition (CVD) growth using silane gas for silicon growth and boron trichloride gas for dopant species.

However the growth and dopant incorporation is achieved, it must be done in such a way that the incorporated dopant atoms are not active. This means that the dopant atoms are not on designated sites as substitutes for the main material atoms. This means that the dopant atoms are interstitial, or between their normal, substitutional sites. This further means that the dopant atoms do not contribute carriers to conduction processes in the layer. This means that the material, as grown, is semi-insulating and does not conduct.

A further step in the creation of the shield layer is the activation of the dopants described above. The activation is typically achieved through an annealing process. This annealing process is effective if the material is heated to a temperature close to (typically, within approximately 100 degrees C. of) its melting point.

In the first preferred embodiment described above, annealing of the entire wafer (blanket annealing) will cause the implanted tracks to become conductive; such blanket annealing may be carried out using any appropriate method known in the art.

In certain preferred embodiments of the present invention, the doped polysilicon is rapidly brought up to the annealing temperature by irradiation from a pulsed light source. The pulsed light source may be an infrared laser. The laser may be a YAG laser (Yttrium Aluminum Garnet, output wavelength 1064 nm). This laser may be driven in pulsed mode with a q-switch to limit the on-time to several nanoseconds or faster. The high power density during the pulse must be sufficient to anneal the dopants in the region of the material absorbing the pulse. In addition, the power density during the pulse must not be sufficient to ablate the material or cause damage to active circuit layers. Such laser annealing is preferred in the second preferred embodiment described above.

In the second preferred embodiment described above, conductive tracks are preferably patterned into the layer by the laser annealing action. The laser, for example, may be scanned across the surface. The pattern of scanning is immaterial but may be raster scanning or following the semi-random path of a track's path from start to end, or, most efficiently, by alternate direction scanning (boustrephorous scanning) of the surface. The annealing will locally activate the dopants in the tracks required.

The annealing must be such that the conductive tracks are physically similar in all important respects to the semi-insulating material between the tracks. An attacker cannot "see", by normal analytical means, the tracks to be bypassed in an attack.

In certain preferred embodiments of the present invention, in order to further frustrate attackers, the path of the conductive tracks is randomized for each shielded chip produced. The randomization helps stop attackers from trying to characterize a device destructively to find the shield path, then applying the information gained to a pristine device. The additional effort required to randomize the path is preferably implemented in control software and is thus independent of processing hardware.

Randomization in this case may mean annealing to form the conductive tracks using straight lines and 90-degree bends (although it is appreciated that it is not necessary to use straight lines and 90-degree bends), but would be random in how the conductive path connects one contact to another. For example, in one chip, one may use the simplest path between two points—a straight line. In another chip the same two contacts could be joined by a long series of meanders, and in other chips by different series of meanders. The intention, as stated above, is to prevent a hacker from discovering the path of the shield in one device and using the path information to bypass the shield in all other devices of the same series of chip.

Even though each chip has the shield conductive paths in different patterns, the end contacts are preferably in the same place in each chip, since photolithographic masks, which are difficult to change, define the locations of the contacts. Manufacturing many different copies of photolithographic masks would be extremely expensive. Therefore, the preferred track "writing" process is serial, enabling each chip to be different without incurring the difficulties inherent in changing the photolithographic masks.

Typically, the conductive paths are connected to underlying circuitry using conventional techniques such as tungsten plug vias, one at each end of each conductive path. It is also expected that, for additional security, dummy vias, as are known in the art, will be present but unused. The addition of dummy vias is intended to foil attempts to penetrate the shield layer based on guesses as to which vias may be bridged to bypass a conductive path. The creation of diversion tracks based on erroneous guesses preferably initiates circuit modes that prevent the chip from operating correctly, as is well-known in the art.

It is appreciated that the control software driving the track annealing process could be programmed to route the conductive tracks automatically by routing the laser on a path with randomly added deviations from a simple path from one track end to the other track end. An alternative and perhaps simpler technique is to have a large but fixed number of conductive path patterns, and to make a random choice of which pattern to use for each chip.

Reference is now made to FIG. 1, which is a simplified pictorial illustration of an integrated circuit 100 having a protective layer, the integrated circuit being constructed and operative in accordance with a preferred embodiment of the present invention. The protective layer of the integrated circuit 100 is intended to enable protection from insecure operation of the integrated circuit 100, as described in more detail below. For purposes of simplicity of depiction, only a portion of the integrated circuit (IC) 100 is shown in FIG. 1.

The IC 100 preferably comprises one or more lower layers 105, as are well known in the art; the lower layers 105 are not shown in detail for purposes of simplicity of depiction. Persons skilled in the art will appreciate that any appropriate type of lower layers 105 may be used in the present invention.

The IC 100 also preferably comprises an upper interconnect layer 110, disposed over the lower layers 105. The upper interconnect layer 110, which typically comprises a plurality of conductive lines 112, may comprise any suitable interconnect layer as is well-known in the art.

The IC 100 also preferably comprises an insulating layer 115, disposed over the upper interconnect layer 110. The insulating layer 115 may comprise any suitable insulating layer as is well-known in the art; preferably but not necessarily, the insulating layer 115 may comprise a passivation layer, as is well-known in the art.

The IC 100 also preferably comprises an additional layer 120, disposed over the insulating layer 115 and preferably substantially completely covering the insulating layer 115. The additional layer 120 includes both a non-conductive portion 125 and a conductive portion 130, the conductive portion 130 defining a conductive path, also referred to herein as a "sub-circuit", within the additional layer 120. The non-conductive portion 125 and the conductive portion 130 are preferably produced in such a way as to make the non-conductive portion 125 and the conductive portion 130 visually indistinguishable from each other. The additional layer 120 and preferred methods of production thereof are described in more detail below with reference to FIGS. 4, 5A, and 5B.

The IC 100 also preferably comprises a plurality of vias, typically including a plurality of "real" vias 135 and a plurality of "false" vias, such as false via 140 and false via 145.

The "real" vias 135 comprise contacts providing electrical connection between the conductive portion 130 and the upper interconnect layer 110. Persons skilled in the art will appreciate that one or more of the "real" vias 135 may alternatively provide electrical connection between the conductive portion 130 and circuit elements within the lower layers 105.

The "false" vias 140 and 145 are intended to give the appearance of "real" vias, but do not actually comprise contacts providing effective electrical connection. The "false" vias 140 and 145 are provided in order to make reverse engineering of the IC 100 more difficult by confusing those who attempt to reverse engineer the IC 100. The false via 140, as depicted in FIG. 1, is situated in the conductive portion 130, while the false via 145 is situated in the non-conductive portion 125.

The IC 100 is preferably provided with protective circuitry (not shown), also termed herein "shield breach detection circuitry", which is situated in the lower layers 105. The protective circuitry is in electrical communication with the conductive portion 130 via a plurality of the "real" vias 135, and is preferably operative to initiate a "breach detected" mode designed to protect the IC 100 from operating insecurely. Use of such protective circuitry to initiate a "breach detected" mode when prior art shields are breached is well-known in the art; persons skilled in the art will appreciate that protective circuitry similar to that known in the art may be used in preferred embodiments of the present invention.

Persons skilled in the art will appreciate that the relative thicknesses of the lower layers 105, the interconnect layer 110, the insulating layer 115, and the additional layer 120, as depicted in FIG. 1, do not necessarily reflect the actual relative thicknesses of said layers.

Persons skilled in the art will appreciate that the relative widths of the conductive lines 112, the vias 135, 140 and 145, and the conductive portion 130, as depicted in FIG. 1, do not necessarily reflect the actual relative widths of those components.

The IC 100 is preferably provided with a passivation layer (not shown) and possibly also other layers above additional layer 120.

It will be appreciated by persons skilled in the art that the additional layer 120 may or may not comprise the uppermost layer of the IC 100; that is, there may or may not be additional layers (not shown) situated over the additional layer 120.

Reference is now made to FIGS. 2-4, 5A, and 5B, which are simplified pictorial illustrations depicting a preferred method of producing the integrated circuit of FIG. 1.

Figure 2:
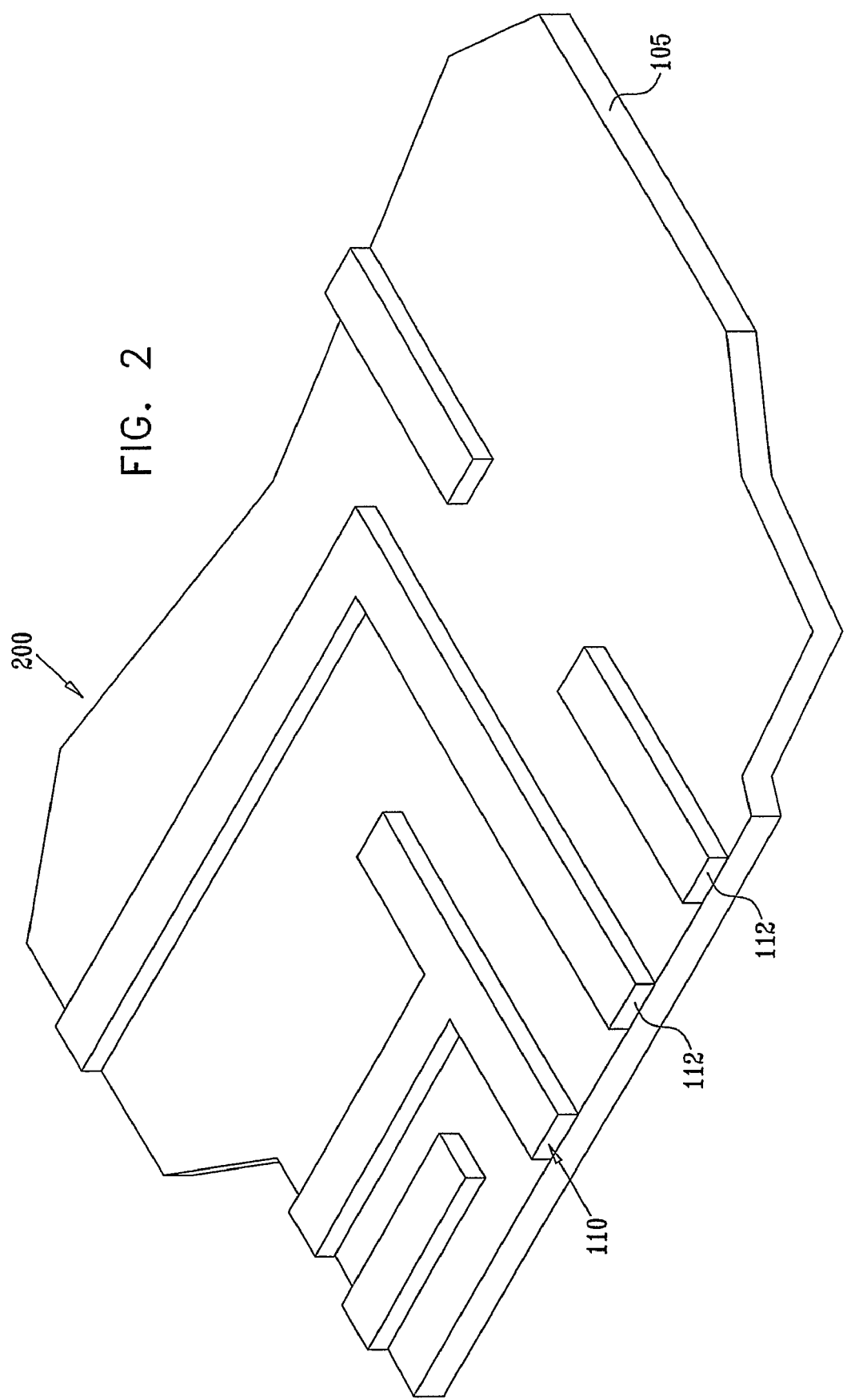

FIG. 2 is a simplified pictorial illustration of an integrated circuit 200. The integrated circuit 200 comprises one or more lower layers 105 and an upper interconnect layer 110, as is well-known in the art.

Figure 3:
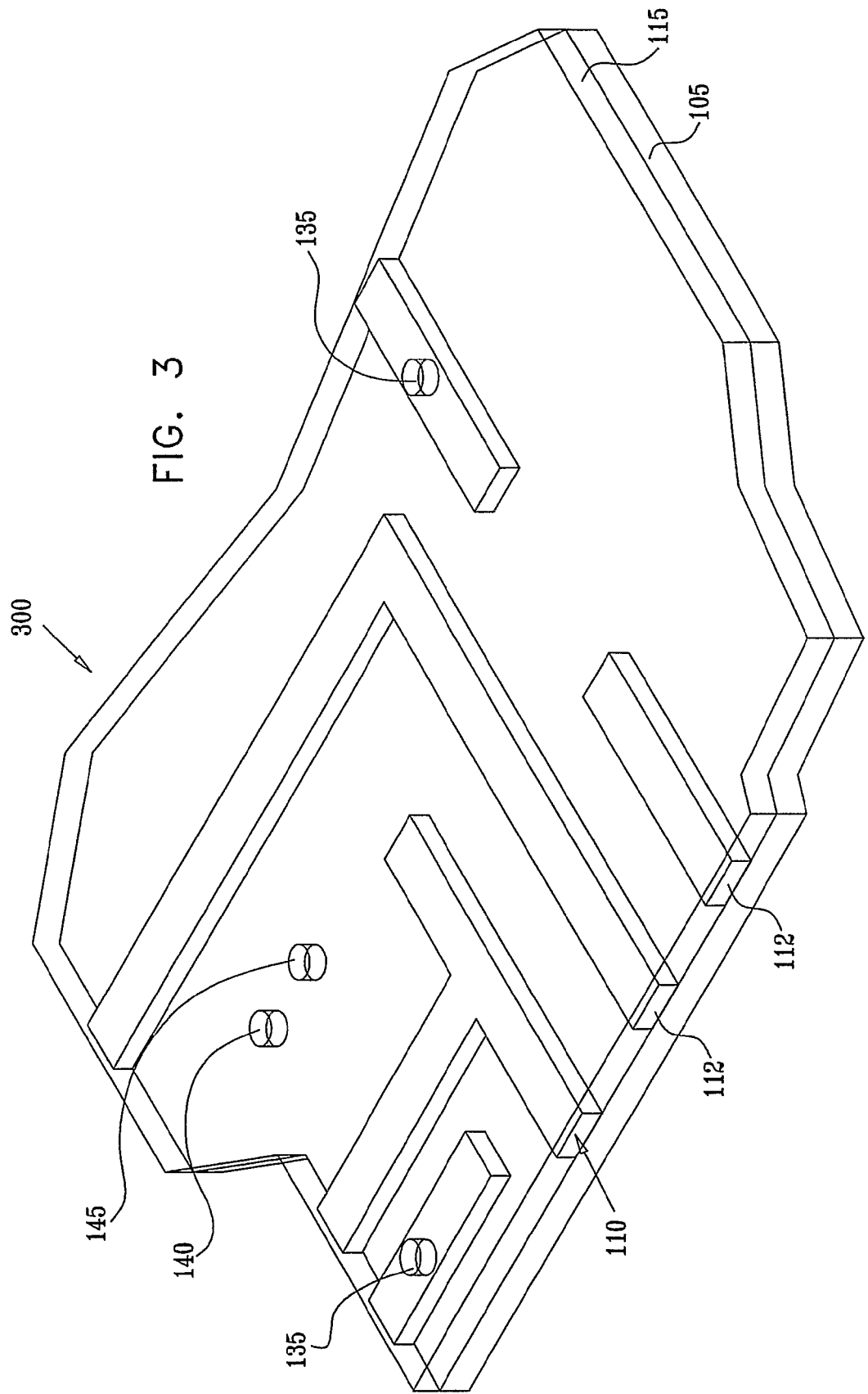

FIG. 3 is a simplified pictorial illustration of an integrated circuit 300, produced by depositing, on top of the integrated circuit 200 of FIG. 2, an insulating layer 115. The insulating layer 115 may be deposited using any appropriate production method well known in the art. The insulating layer 115 includes vias 135, 140, and 145, which vias are preferably produced using any appropriate production method well known in the art.

As explained above with reference to FIG. 1, the vias 135, 140 and 145 typically include a plurality of "real" vias 135 and a plurality of "false" vias, such as false via 140 and false via 145.

The "real" vias 135 comprise holes in the insulating layer 115 to provide openings for subsequent electrical contacts between additional layer 120 (FIG. 1) and the interconnect layer 110.

Although the "real" vias 135 are shown in FIG. 3 as providing electrical contacts to the interconnect layer 110, persons skilled in the art will appreciate that the "real" vias 135 may alternatively provide openings for electrical contacts directly between the additional layer 120 (FIG. 1) and circuit elements within the lower layers 105 without connecting to the interconnect layer 110.

Persons skilled in the art will appreciate that "false" vias such as "false" via 140 and "false" via 145 may be placed in any appropriate position such that their placement will not enable unwanted electrical contacts between the additional layer 120 (FIG. 1) and either the interconnect layer 110 or the lower layers 105. For example, both the "false" via 140 and the "false" via 145 are located such that their placement will not enable electrical contact between the additional layer 120 (FIG. 1) and the interconnect layer 110.

Persons skilled in the art will appreciate that an extra via (not shown) may be located on top of the same interconnect line as a real via 135, thus creating an unnecessary extra via located to confuse attempts of reverse engineering.

A "false" via may additionally be located on top of an interconnect line which is not part of the breach detection circuit, as long as it is not also underneath a conductive portion 130 (FIG. 1) that is part of the additional layer 120 (FIG. 1).

Figure 4:
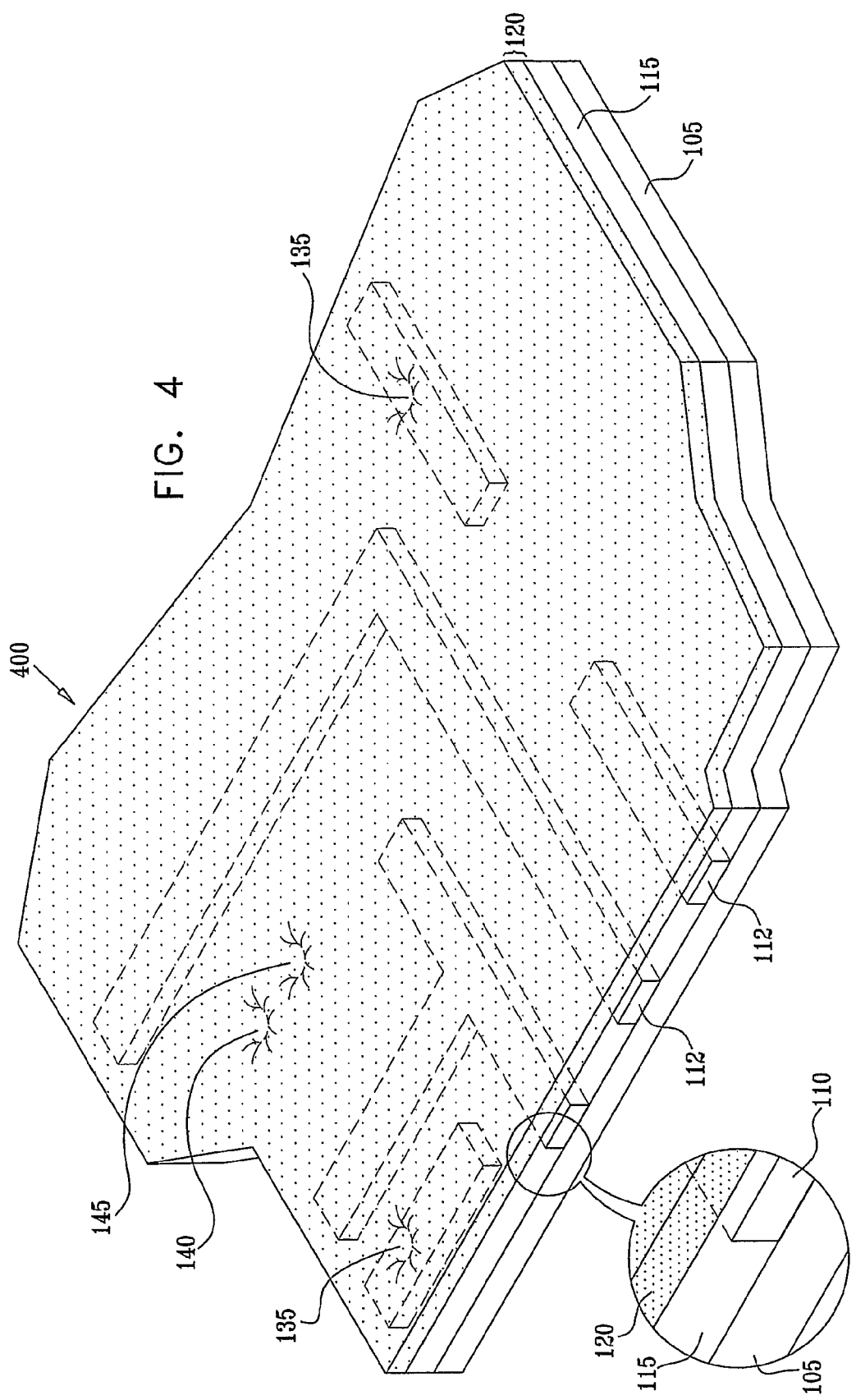

FIG. 4 is a simplified pictorial illustration of an integrated circuit 400, produced by depositing, on top of the integrated circuit 300 of FIG. 3, an additional layer 120. The additional layer 120 preferably comprises doped polysilicon. Persons skilled in the art will appreciate that doped polysilicon becomes substantially conductive in portions which undergo annealing, while remaining substantially insulating in portions which are not annealed. The additional layer 120 may be deposited using any appropriate production method well known in the art. The doping of the polysilicon may be achieved by any appropriate doping method well known in the art FIG. 5A is a simplified pictorial illustration of an integrated circuit 500, produced by selectively annealing, using a laser beam 510, a portion of the additional layer 120 of integrated circuit 400. The laser beam 510 is depicted in FIG. 5A in the process of drawing a path, preferably comprising a serpentine path, the path including the "real" vias 135 and the "false" via 140.

It is appreciated that the conductive portion 130 provides a conductive path from "real" via 135 to another "real" via 135. An attempt to reverse engineer the integrated circuit that would cause a break in the conductive path between "real" via 135 and another "real" via 135 would preferably be detected by shield breach detection circuitry (not shown) situated in the lower layers 105, as described above with reference to FIG. 1, thereby causing initiation of a "breach detected" mode designed to protect the chip from operating insecurely.

It is appreciated that the conductive portion 130 and the non-conductive portion 125 are produced in a very similar manner, and that laser annealing of the conductive portion 130 does not introduce significant differences, beyond the change in conductivity, in the conductive portion 130. Therefore, the conductive portion 130 and the non-conductive portion 125 appear identical to most or all readily available analytical techniques. An attacker therefore does not know where the conductive portion is located, and the attacker is not provided with information needed in order to successfully bypass the conductive portion 130 without disrupting conductivity between the "real" vias 135.

The addition of "false" vias is designed to make an attacker's task even more difficult by providing a misleading indication as to where a conductive portion might be expected to be located.

The location of "false" vias may either be under a conductive portion 130, such as, for example, "false" via 140, or under a non-conductive portion 125, such as, for example, "false" via 145. Thus, an attacker cannot assume that the existence of a via is indication of the location of the conductive portion 130 of the additional layer 120.

Figure 5B:
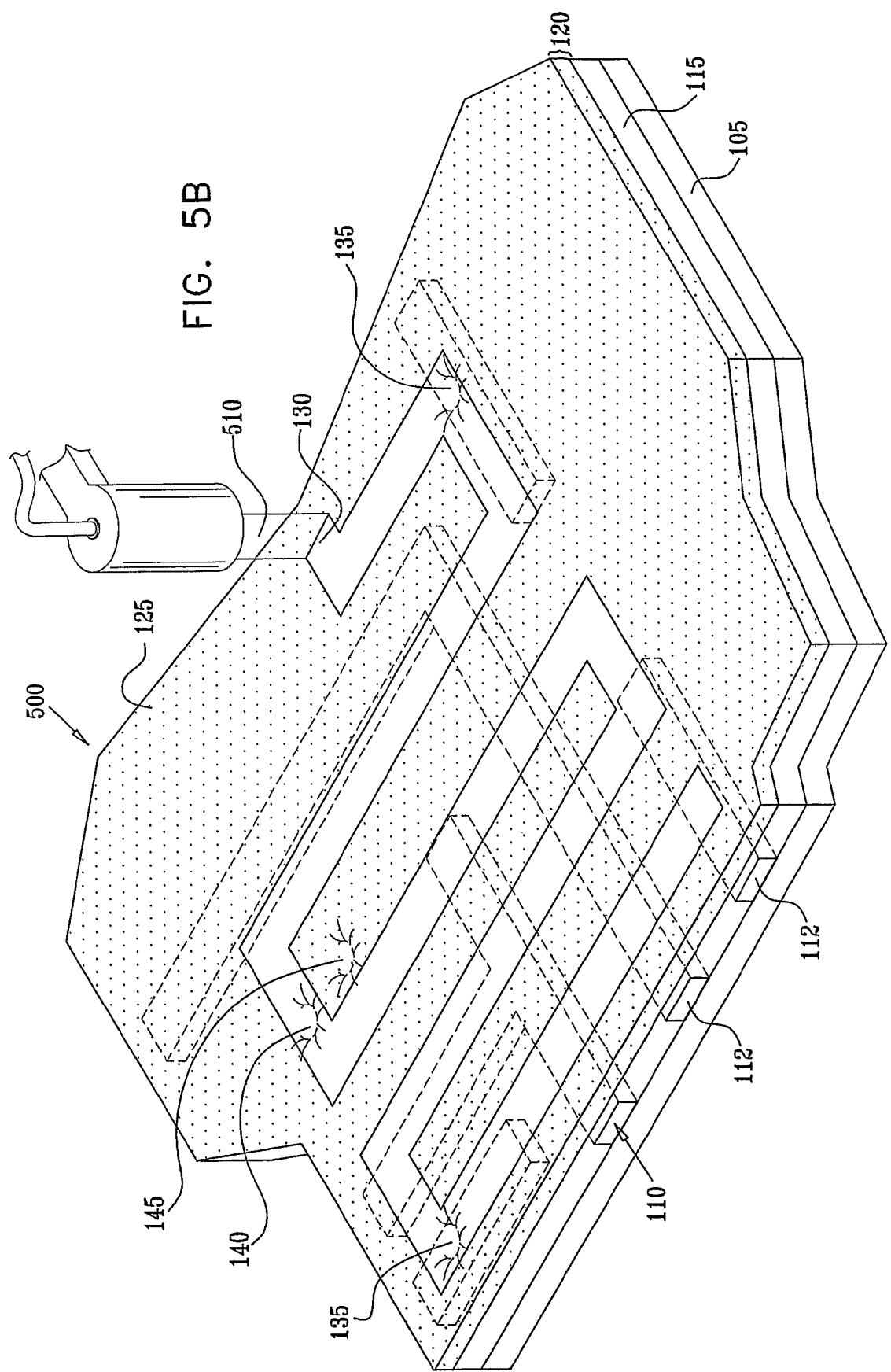

FIG. 5B is a simplified pictorial illustration of the integrated circuit 500, later in the process of selective annealing. The laser beam 510 is depicted in FIG. 5B later in the process of drawing the path of the conductive portion 130.

In certain preferred embodiments of the present invention, the path of the conductive portion 130, particularly the path from one "real" via 135 to another "real" via 135, is preferably "randomized" for each shielded chip produced. Randomization may be accomplished by annealing to form the paths of the conductive portion 130 using straight lines and 90-degree bends (although it is appreciated that it is not necessary to use straight lines and 90-degree bends), but with variations in the details of the path of the conductive portion 130 which connects one "real" via 135 to another "real" via 135. For example, in one integrated circuit, the simplest path, a straight line, between the two "real" vias 135 is used. In another chip the same two "real" vias 135 are joined by a longer series of meanders comprising straight lines and 90-degree bends, and in other chips the same two "real" vias 135 are joined by different series of meanders. The purpose, as stated above, is to prevent an attacker from discovering the path of the conductive portion 130 in one device and using the information discovered to bypass the shield in other devices.

Producing a different path of the conductive portion 130 for each integrated circuit, when selective annealing is achieved by selective laser annealing, is preferably accomplished by programming the path of the laser beam 510 performing the selective annealing. It will be appreciated that programming a different path for each integrated circuit does not substantially add to the time it takes to produce the selectively annealed conductive portion 130. The changes to the path of the conductive portion 130 are preferably constrained so that the "real" vias 135 remain connected, and additionally so that no "false" via gets connected to a circuit to which it should not be connected.

Reference is now made to FIGS. 6A-6F, which are simplified pictorial illustrations of an alternative preferred method of producing the integrated circuit of FIG. 1.

FIG. 6A is a simplified pictorial illustration of an integrated circuit 600, produced by depositing, on top of the integrated circuit 300 of FIG. 3, an additional layer 602. The additional layer 602 preferably comprises undoped polysilicon.

FIG. 613 is a simplified pictorial illustration of an integrated circuit 605, produced by depositing, on top of the integrated circuit 600 of FIG. 6A, an additional layer 610. The additional layer 610 preferably comprises positive photoresist.

FIG. 6C is a simplified pictorial illustration of an integrated circuit 620, produced by selectively exposing, using a laser beam 625, a portion 630 of the additional layer 610 of integrated circuit 605. The laser beam 625 is depicted in FIG. 6C in the process of drawing a path comprised of a portion 630 of exposed photoresist. The portion 630 of exposed photoresist preferably comprises a serpentine path, the path including the "real" vias 135 and the "false" via 140.

Persons skilled in the art will appreciate that the method depicted in FIG. 6C comprises a so-called "direct write" method, as is well-known in the art. Persons skilled in the art will further appreciate that the laser beam 625 used in FIG. 6C should be chosen to be appropriate for direct write, and that the laser beam 625 may be different from the laser beam 510 (FIGS. 5A and 5B).

It will further be appreciated that other methods may be used instead of the direct write method. For example, and without limiting the generality of the foregoing, methods such as those described in PCT Published Patent Application WO 01/54194, referred to above and incorporated herein by reference, may be used.

Figure 6B:
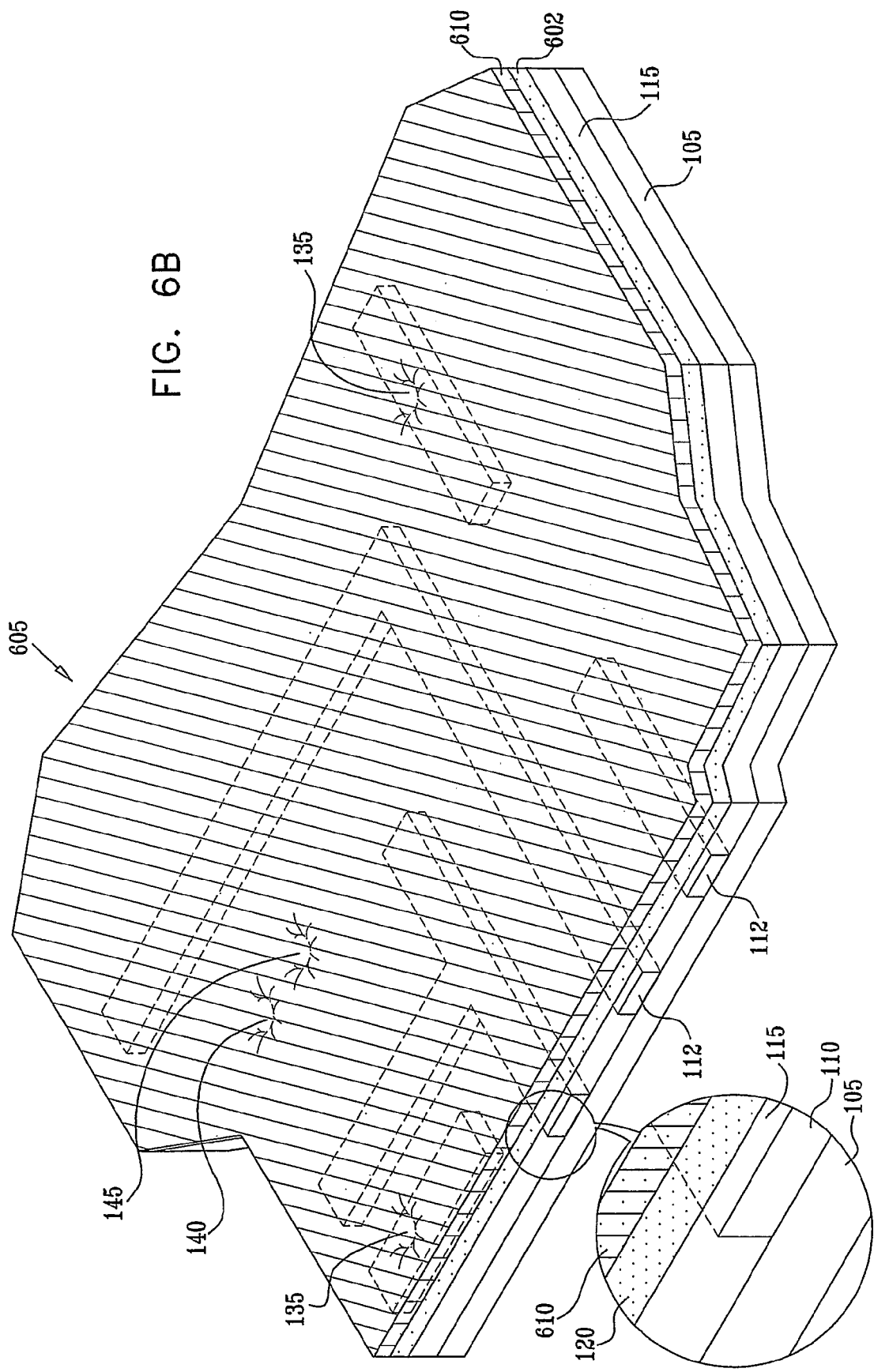
Figure 6D:
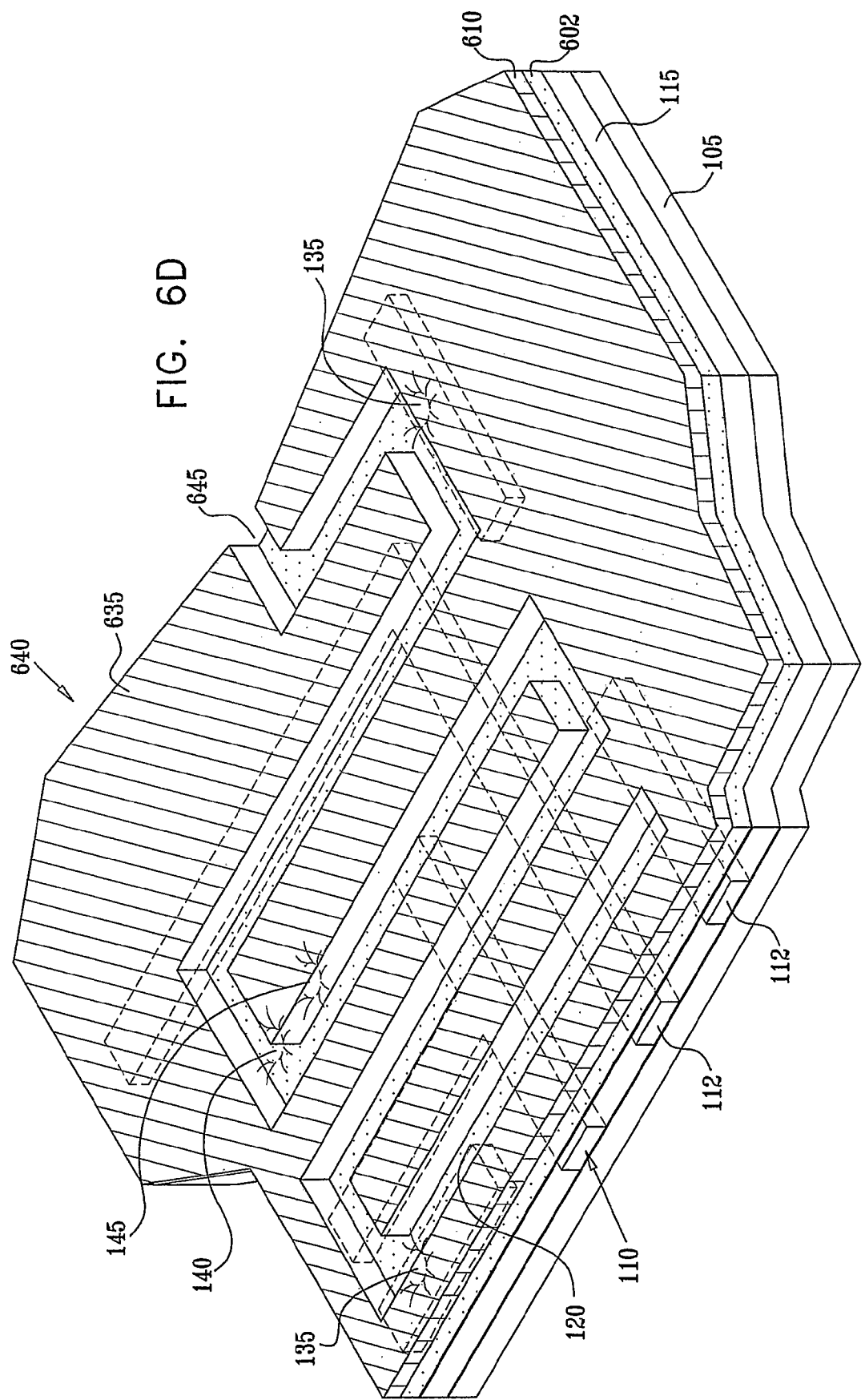

FIG. 6D is a simplified pictorial illustration of an integrated circuit 640, produced by developing the photoresist layer 610 of integrated circuit 620. The path of selective exposure (portion 630 of FIG. 6C) is now portion 645 of photoresist layer 610. Portion 645 of photoresist layer 610 is now clear of photoresist, and exposes layer 602. The unexposed portion 635 of photoresist layer 610 remains deposited on top of and covering portions of integrated circuit 640.

FIG. 6E is a simplified pictorial illustration of an integrated circuit 660, produced by the process of ion implantation of integrated circuit 640. It is appreciated that the process of ion implantation causes dopant ions to become implanted in a portion of layer 602, since portion 645 exposes layer 602 to an ion implantation beam 665. Dopant ions are absorbed by portion 635 of the photoresist layer 610, thus being prevented from becoming implanted in that portion of layer 602 which lies directly underneath portion 635.

Figure 6F:
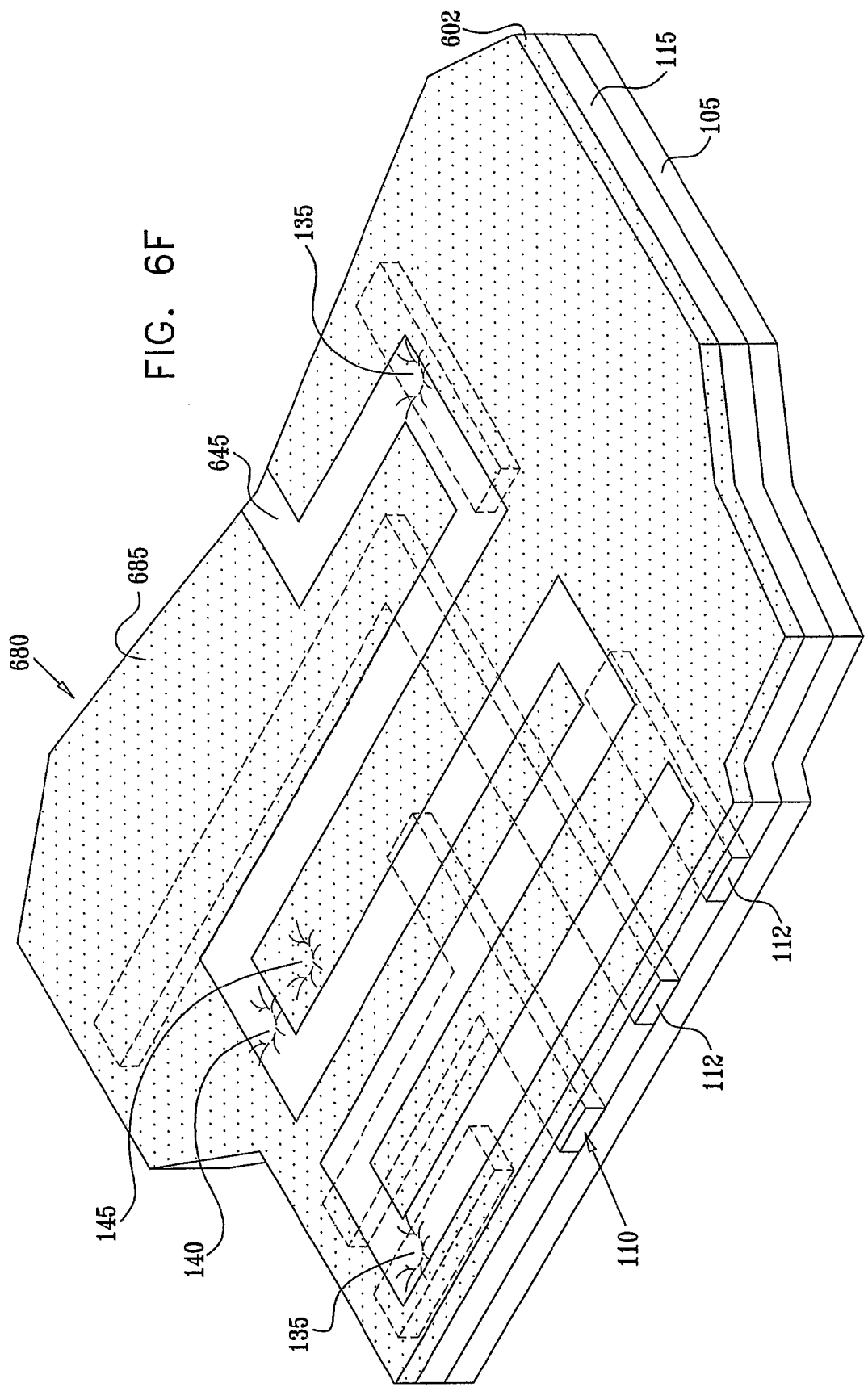

FIG. 6F is a simplified pictorial illustration of an integrated circuit 680, produced by stripping the photoresist (portion 635 of the photoresist layer 610 of FIG. 6E) from integrated circuit 660, and subsequently annealing integrated circuit 660. It is appreciated that the annealing of integrated circuit 660 is not selective, and is performed upon the entire wafer at once. Annealing causes the implanted portion 645 of layer 602 to become substantially more conductive than the non-implanted portion 685 of layer 602.

The result of performing the alternative preferred method for producing the integrated circuit of FIG. 1, as depicted in FIGS. 6A-6F, is similar to the result of performing the method of FIGS. 4, 5A and 5B. In particular, the following results discussed above with reference to FIGS. 4, 5A and 5B are preferably achieved by the method of FIGS. 6A-6F: the production of conductive tracks visually indistinguishable from a non-conductive portion of the integrated circuit; and the relative location of "real" vias and "false" vias.

Referring back to FIG. 1, the conductive portion 130 is depicted as having a serpentine shape. The serpentine shape is depicted as one non-limiting example, it being appreciated that the shape may be different and may be more complex. For example and without limiting the generality of the foregoing, in some preferred embodiments of the present invention the conductive portion 130 is shaped in separate conductive paths which are arranged side-by-side, such that a "breach detected" mode is preferably initiated if one conductive path is connected electrically to another conductive path. For example, a conductive path at a voltage of 5V is arranged parallel to a conductive path at a voltage of 0V. If the 5V path and the 0V path were to be electrically connected, the shield breach detection circuitry described herein is preferably operative to cause a breach to be detected.

Reference is now made to FIGS. 7A and 7B, which are simplified pictorial illustrations depicting two alternative preferred patterns of the conductive portion 130 of the protective layer 120 of the integrated circuit of FIG. 1. The pattern of conductive portion 130 may be as produced in FIG. 7A, with "real" vias 135 providing electrical communication with "shield breach detection circuitry" (not shown) described above, which is situated in the lower layers 105 (FIG. 1). The pattern in FIG. 7A is especially useful for detecting breaks in the conductive portion 130.

Alternatively, the pattern of conductive portion 130 may be as shown in FIG. 7B, with "real" vias 135 providing electrical communication with the "shield breach detection circuitry" (not shown) described above, which is situated in the lower layers 105. The pattern in FIG. 7B is especially useful for detecting "shorts" in the conductive portion 130.

Without limiting the generality of the foregoing, a mixture of both types of patterns on the same chip, as well as other useful patterns, may be used to provide protection against attackers as referenced above. Furthermore without limiting the generality of the foregoing, a mixture as described above is especially effective against FIB attacks comprising diversion tracks.

Figure 8:
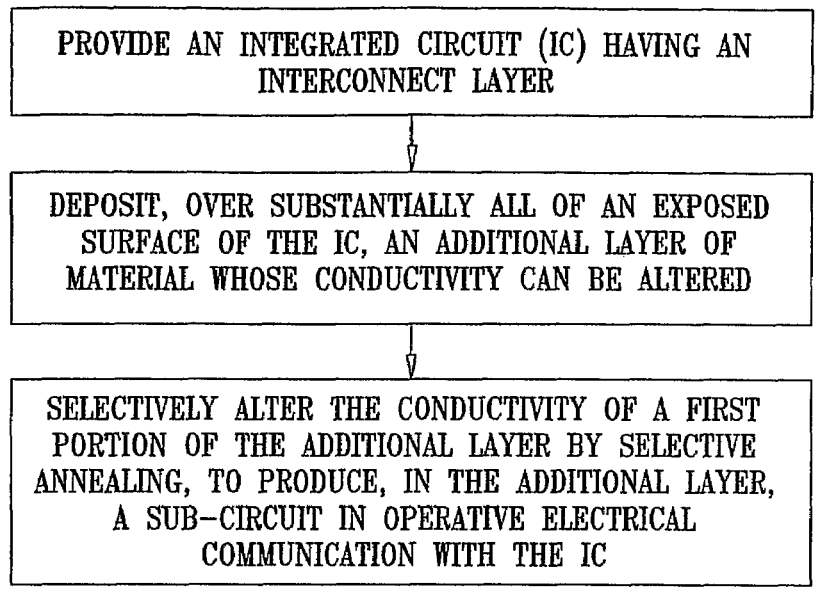
FIG. 8 is a simplified flowchart illustration of a preferred method of producing the integrated circuit of FIG. 1.
Figure 9:
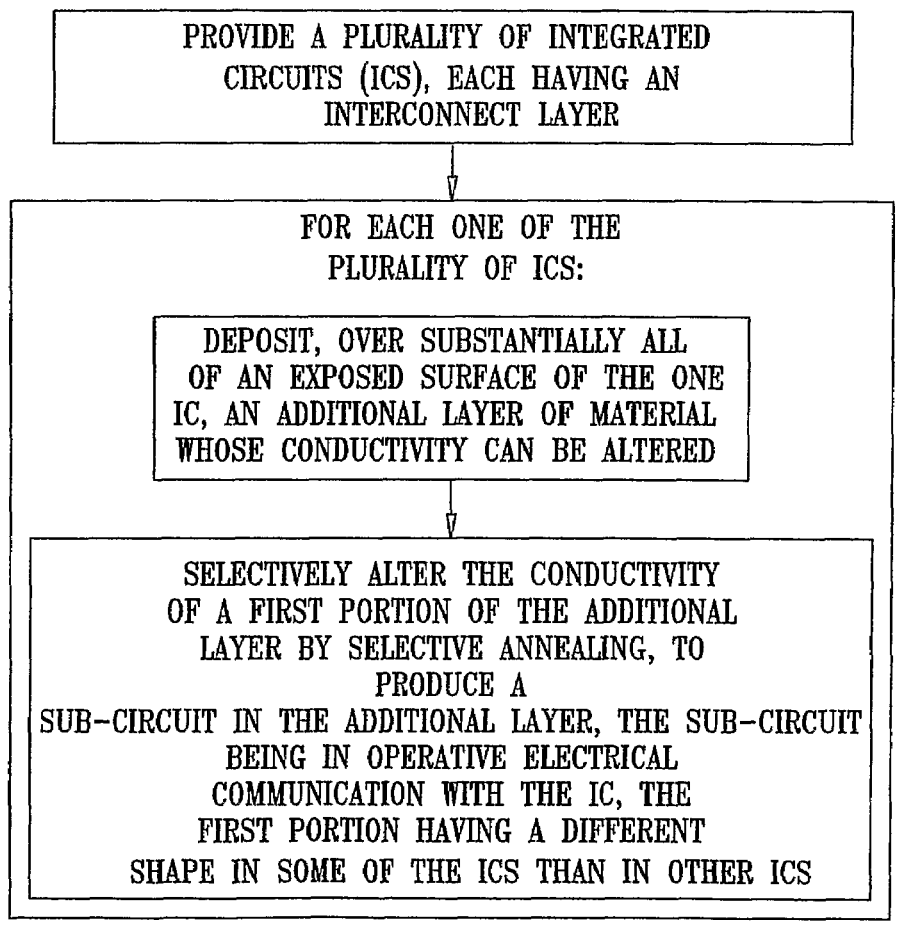
FIG. 9 is a simplified flowchart illustration of a preferred method of producing a plurality of related integrated circuits, each of the plurality of integrated circuits being similar to the integrated circuit of FIG. 1.

Reference is now made to FIG. 8 which is a simplified flowchart illustration of a preferred method of producing the integrated circuit of FIG. 1. The method of FIG. 8 is self-explanatory in light of the above discussion of FIGS. 2-4, 5A, and 5B Reference is now made to FIG. 9 which is a simplified flowchart illustration of a preferred method of producing a plurality of related integrated circuits, each of the plurality of integrated circuits being similar to the integrated circuit of FIG. 1. The method of FIG. 9 is self-explanatory in light of the above discussion of FIGS. 2-4, 5A, and 5B.

Figure 10:
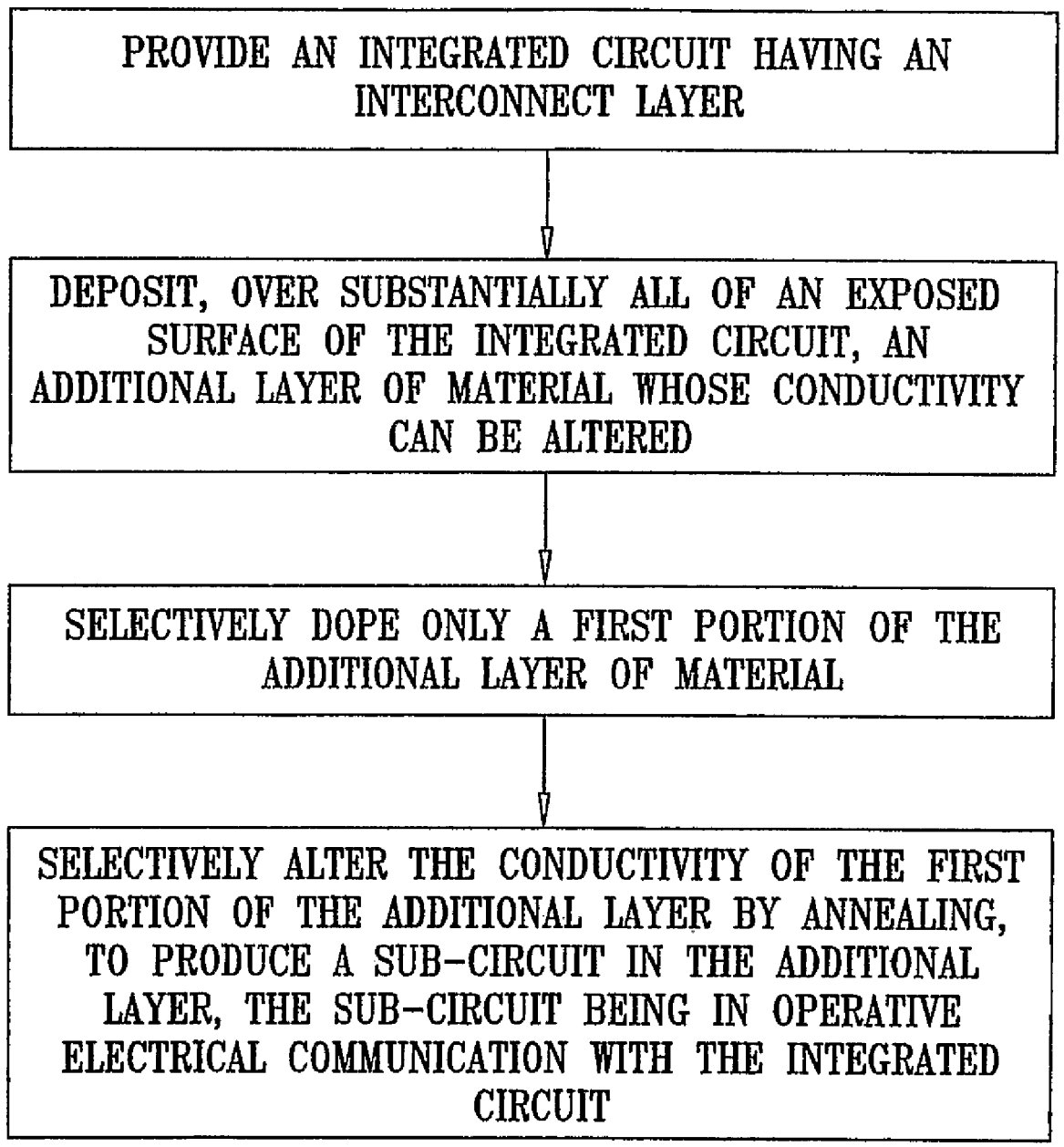
FIG. 10 is a simplified flowchart illustration of an alternative preferred method of producing the integrated circuit of FIG. 1.

Reference is now made to FIG. 10 which is a simplified flowchart illustration of an alternative preferred method of producing the integrated circuit of FIG. 1. The method of FIG. 10 is self-explanatory in light of the above discussion of FIGS. 6A-6F.

Figure 11:
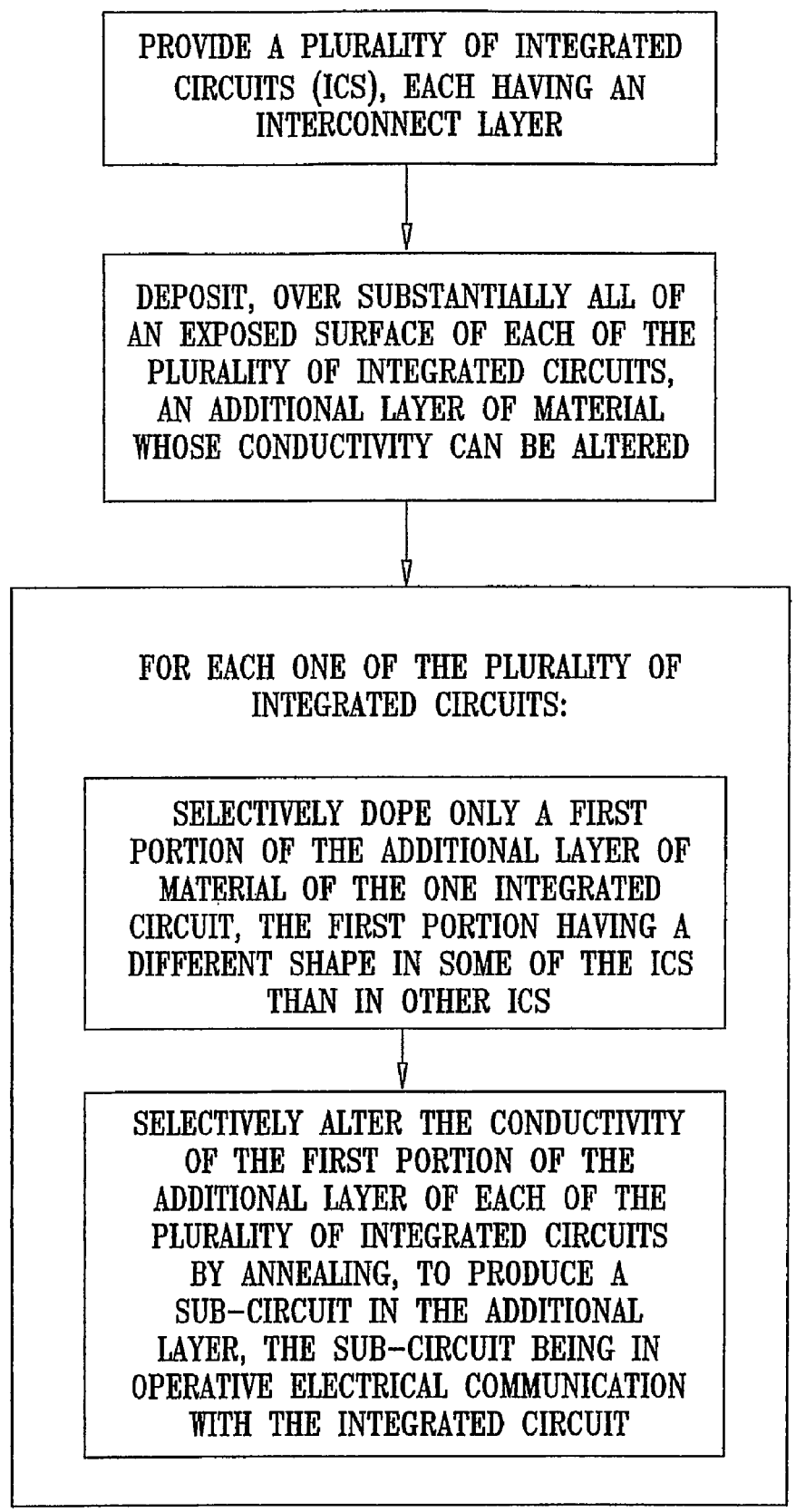
FIG. 11 is a simplified flowchart illustration of an alternative preferred method of producing a plurality of related integrated circuits, each of the plurality of integrated circuits being similar to the integrated circuit of FIG. 1.

Reference is now made to FIG. 11 which is a simplified flowchart illustration of an alternative preferred method of producing a plurality of related integrated circuits, each of the plurality of integrated circuits being similar to the integrated circuit of FIG. 1. The method of FIG. 11 is self-explanatory in light of the above discussion of FIGS. 6A-6F.

It is appreciated that various features of the invention which are, for clarity, described in the contexts of separate embodiments may also be provided in combination in a single embodiment. Conversely, various features of the invention which are, for brevity, described in the context of a single embodiment may also be provided separately or in any suitable subcombination.

It will be appreciated by persons skilled in the art that the present invention is not limited by what has been particularly shown and described hereinabove. Rather the scope of the invention is defined only by the claims which follow:

What is claimed is:

1. A method for adding an additional layer to an integrated circuit, the method comprising:
   providing an integrated circuit having an interconnect layer;
   depositing, over substantially all of an exposed surface of the integrated circuit, an additional layer of material whose conductivity can be altered; and
   selectively altering the conductivity of a first portion of the additional layer by selective annealing, to produce a sub-circuit in the additional layer, the sub-circuit being in operative electrical communication with the integrated circuits,
   wherein the sub-circuit is not visually distinguishable from a second portion of the additional layer, the second portion being disjoint from the first portion.

2. The method according to claim 1 and wherein the selective annealing comprises selective laser annealing.

3. The method according to claim 1 and wherein the second portion comprises substantially all parts of the additional layer not comprised in the first portion.

4. The method according to claim 1 and wherein the selectively altering comprises altering substantially without removing any part of the additional layer.

5. An integrated circuit produced by the method of claim 1.

6. The method according to claim 1 and wherein the additional layer is made of polycrystalline silicon.

7. The method according to claim 1 and wherein the selectively altering comprises altering substantially without removing any part of the additional layer.

8. A method for adding an additional layer to a plurality of integrated circuits, the method comprising:
   providing a plurality of integrated circuits, each having an interconnect layer;
   performing the following for each one of the plurality of integrated circuits:
      depositing, over substantially all of an exposed surface of the one integrated circuit, an additional layer of material whose conductivity can be altered; and
      selectively altering the conductivity of a first portion of the additional layer by selective annealing, to produce a sub-circuit in the additional layer, the sub-circuit being in operative electrical communication with the integrated circuit,
   wherein the first portion of each integrated circuit has a shape, and, for at least a first integrated circuit and a second integrated circuit of the plurality of integrated circuits, the shape of the first portion of the first integrated circuit is different from the shape of the first portion of the second integrated circuit.

9. The method according to claim 8 and wherein the shape of the first portion of each one of the plurality of integrated circuits on a production wafer is different from the shape of the first portion of any other of the plurality of integrated circuits on the production wafer.

10. The method according to claim 8 and wherein the selective annealing comprises selective laser annealing.

11. The method according to claim 8 and wherein the sub-circuit is not visually distinguishable from a second portion of the additional layer, the second portion being disjoint from the first portion.

12. The method according to claim 11 and wherein the second portion comprises substantially all parts of the additional layer not comprised in the first portion.

13. The method according to claim 8 and wherein the selectively altering comprises altering substantially without removing any part of the additional layer.

14. A plurality of integrated circuits, produced by the method of claim 8.

15. The method according to claim 8 and wherein the selectively altering comprises altering substantially without removing any part of the additional layer.

16. A method for adding an additional layer to an integrated circuit, the method comprising:
   providing an integrated circuit having an interconnect layer;
   depositing, over substantially all of an exposed surface of the integrated circuit, an additional layer of material whose conductivity can be altered;
   selectively doping only a first portion of the additional layer of material; and
   selectively altering the conductivity of the first portion of the additional layer by annealing, to produce a sub-circuit in the additional layer, the sub-circuit being in operative electrical communication with the integrated circuit, wherein the sub-circuit is not visually distinguishable from a second portion of the additional layer, the second portion being disjoint from the first portion.

17. The method according to claim 16 and wherein the second portion comprises substantially all parts of the additional layer not comprised in the first portion.

18. An integrated circuit produced by the method of claim 16.

19. The method according to claim 16 and wherein the selectively altering comprises altering substantially without removing any part of the additional layer.

20. A method for adding an additional layer to a plurality of integrated circuits, the method comprising:
   providing a plurality of integrated circuits, each having an interconnect layer;
   depositing, over substantially all of an exposed surface of each of the plurality of integrated circuits, an additional layer of material whose conductivity can be altered;
   for each one of the plurality of integrated circuits, selectively doping only a first portion of the additional layer of material of the one integrated circuit; and
   selectively altering the conductivity of the first portion of the additional layer of each of the plurality of integrated circuits by annealing, to produce a sub-circuit in the additional layer, the sub-circuit being in operative electrical communication with the integrated circuit, wherein the first portion of each integrated circuit has a shape, and, for at least a first integrated circuit and a second integrated circuit of the plurality of integrated circuits, the shape of the first portion of the first integrated circuit is different from the shape of the first portion of the second integrated circuit.

21. The method according to claim 20 and wherein the shape of the first portion of each one of the plurality of integrated circuits on a production wafer is different from the shape of the first portion of any other of the plurality of integrated circuits on the production wafer.

22. The method according to claim 20 and wherein the sub-circuit is not visually distinguishable from a second portion of the additional layer, the second portion being disjoint from the first portion.

23. The method according to claim 22 and wherein the second portion comprises substantially all parts of the additional layer not comprised in the first portion.

24. A plurality of integrated circuits, produced by the method of claim 20.

25. The method according to claim 20 and wherein the selectively altering comprises altering substantially without removing any part of the additional layer.

26. A method for producing an integrated circuit, the method comprising:
  providing a lower integrated circuit portion including an interconnect layer; and
  producing an additional layer of material disposed over substantially all of a surface of the lower integrated circuit portion, the additional layer comprising a first portion, the first portion comprising a sub-circuit in operative electrical communication with the lower integrated circuit portion, the sub-circuit being not visually distinguishable from a second portion of the additional layer, the second portion being disjoint from the first portion.

27. The method according to claim 26 and wherein the producing comprises:
  depositing, over substantially all of an exposed surface of the lower integrated circuit portion, an additional layer of material whose conductivity can be altered; and
  selectively altering the conductivity of a first portion of the additional layer by selective annealing, thereby producing the sub-circuit.

28. The method according to claim 27 and wherein the selective annealing comprises selective laser annealing.

29. The method according to claim 27 and wherein the selectively altering comprises altering substantially without removing any part of the additional layer.

30. The method according to claim 26 and wherein the producing comprises:
  depositing, over substantially all of an exposed surface of the lower integrated circuit portion, an additional layer of material whose conductivity can be altered;
  selectively doping only a first portion of the additional layer of material; and
  selectively altering the conductivity of the first portion of the additional layer by annealing.

31. The method according to claim 26 and wherein the second portion comprises substantially all parts of the additional layer not comprised in the first portion.

32. The method according to claim 26 and wherein the first portion has a shape, and, for at least a first integrated circuit and a second integrated circuit of a plurality of integrated circuits on a production wafer, the shape of the first portion of the first integrated circuit is different from the shape of the first portion of the second integrated circuit.

33. The method according to claim 32 and wherein the shape of the first portion of each one of the plurality of integrated circuits on a production wafer is different from the shape of the first portion of any other of the plurality of integrated circuits on a production wafer.

* * * * *

UNITED STATES PATENT AND TRADEMARK OFFICE
CERTIFICATE OF CORRECTION

PATENT NO. : 7,732,321 B2  Page 1 of 1
APPLICATION NO. : 10/593386
DATED : June 8, 2010
INVENTOR(S) : Walker It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 470 days.

please delete "613" and insert therefor --6B-- in column 11, line 26.

Signed and Sealed this

Twenty-first Day of September, 2010

David J. Kappos
*Director of the United States Patent and Trademark Office*